(12) United States Patent
Huang et al.

(10) Patent No.: US 11,601,106 B2
(45) Date of Patent: *Mar. 7, 2023

(54) THIN-FILM BULK ACOUSTIC RESONATOR AND SEMICONDUCTOR APPARATUS COMPRISING THE SAME

(71) Applicants: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

(72) Inventors: Herb He Huang, Shanghai (CN); Clifford Ian Drowley, Shanghai (CN); Jiguang Zhu, Shanghai (CN); Halting Li, Shanghai (CN)

(73) Assignees: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 346 days.

This patent is subject to a terminal disclaimer.

(21) Appl. No.: 16/868,373

(22) Filed: May 6, 2020

(65) Prior Publication Data

US 2020/0266790 A1 Aug. 20, 2020

Related U.S. Application Data

(62) Division of application No. 15/416,828, filed on Jan. 26, 2017, now Pat. No. 10,686,422.

(30) Foreign Application Priority Data

Mar. 10, 2016 (CN) .......................... 201610135996.6

(51) Int. Cl.
H03H 3/02 (2006.01)
H03H 9/17 (2006.01)
(Continued)

(52) U.S. Cl.
CPC ............... H03H 3/02 (2013.01); H01L 27/20 (2013.01); H03H 3/0073 (2013.01);
(Continued)

(58) Field of Classification Search
CPC .. H03H 9/02007; H03H 9/1035; H03H 9/171; H03H 9/173; H03H 9/587; H01L 27/20
See application file for complete search history.

(56) References Cited

U.S. PATENT DOCUMENTS

2005/0140247 A1 6/2005 Lee
2005/0218488 A1 10/2005 Matsuo
(Continued)

FOREIGN PATENT DOCUMENTS

EP 1469599 A2 10/2004
EP 1533896 A2 5/2005
(Continued)

OTHER PUBLICATIONS

EP Search Report, EP17158472, dated Nov. 13, 2017, 3 pages.

*Primary Examiner* — Jeffrey M Shin
(74) *Attorney, Agent, or Firm* — Anova Law Group, PLLC

(57) ABSTRACT

A thin-film bulk acoustic resonator (FBAR) apparatus includes a lower dielectric layer including a first cavity; an upper dielectric layer including a second cavity, wherein the upper dielectric layer is on the lower dielectric layer; and an
(Continued)

acoustic resonance film that is positioned between and separating the first and the second cavities. The acoustic resonance film includes a lower electrode layer, an upper electrode layer, and a piezoelectric film that is sandwiched between the lower and upper electrode layers. A plan view of the first and the second cavities overlap to form an overlapped region having a polygonal shape without parallel sides.

12 Claims, 15 Drawing Sheets

(51) Int. Cl.
| | |
|---|---|
| *H03H 9/05* | (2006.01) |
| *H03H 9/58* | (2006.01) |
| *H03H 9/10* | (2006.01) |
| *H01L 27/20* | (2006.01) |
| *H03H 3/007* | (2006.01) |
| *H03H 9/02* | (2006.01) |
| *H03H 9/15* | (2006.01) |

(52) U.S. Cl.
CPC ...... *H03H 9/02007* (2013.01); *H03H 9/0547* (2013.01); *H03H 9/1035* (2013.01); *H03H 9/171* (2013.01); *H03H 9/173* (2013.01); *H03H 9/587* (2013.01); *H03H 2003/021* (2013.01); *H03H 2003/027* (2013.01); *H03H 2009/155* (2013.01); *Y10T 29/42* (2015.01); *Y10T 29/49005* (2015.01)

(56) References Cited

U.S. PATENT DOCUMENTS

| | | |
|---|---|---|
| 2005/0275696 A1 | 12/2005 | Miyazawa et al. |
| 2006/0006768 A1 | 1/2006 | Ishii |
| 2013/0113577 A1 | 5/2013 | Adkisson et al. |
| 2017/0207764 A1* | 7/2017 | Wang .................. H03H 9/02118 |

FOREIGN PATENT DOCUMENTS

| | | |
|---|---|---|
| JP | 03167913 A | 7/1991 |
| JP | 2003309445 A | 10/2003 |
| JP | 2007142372 A | 6/2007 |

\* cited by examiner

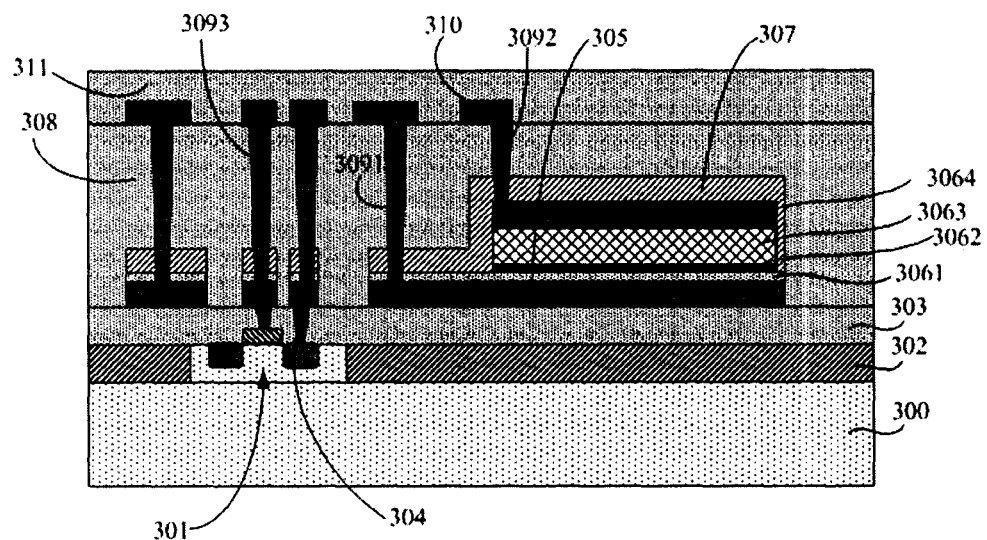
FIG. 3E
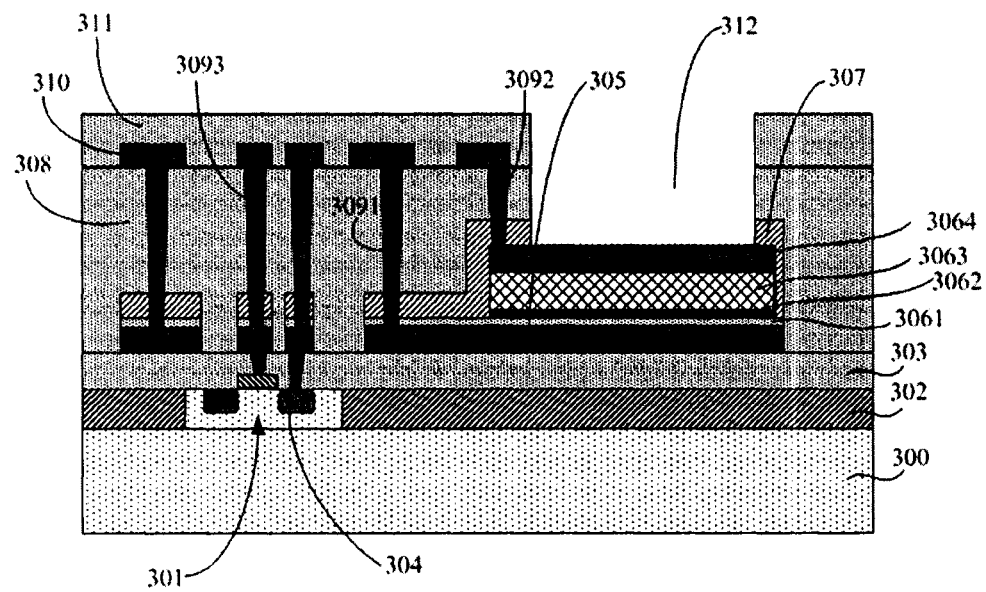
FIG. 3F1

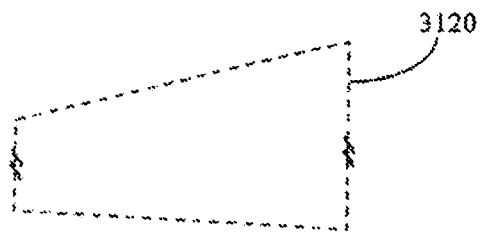
Fig. 3F2

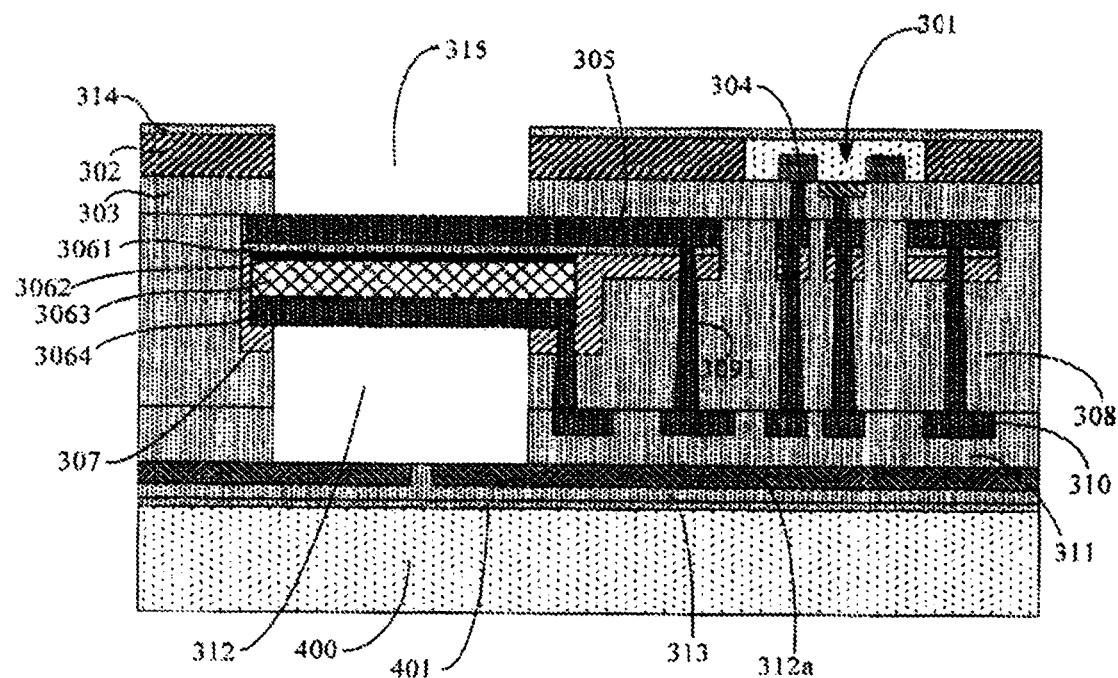
Fig. 3L1
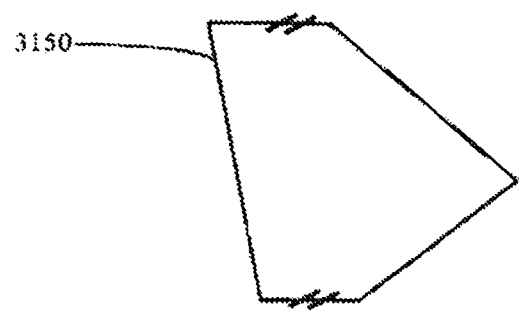
Fig. 3L2

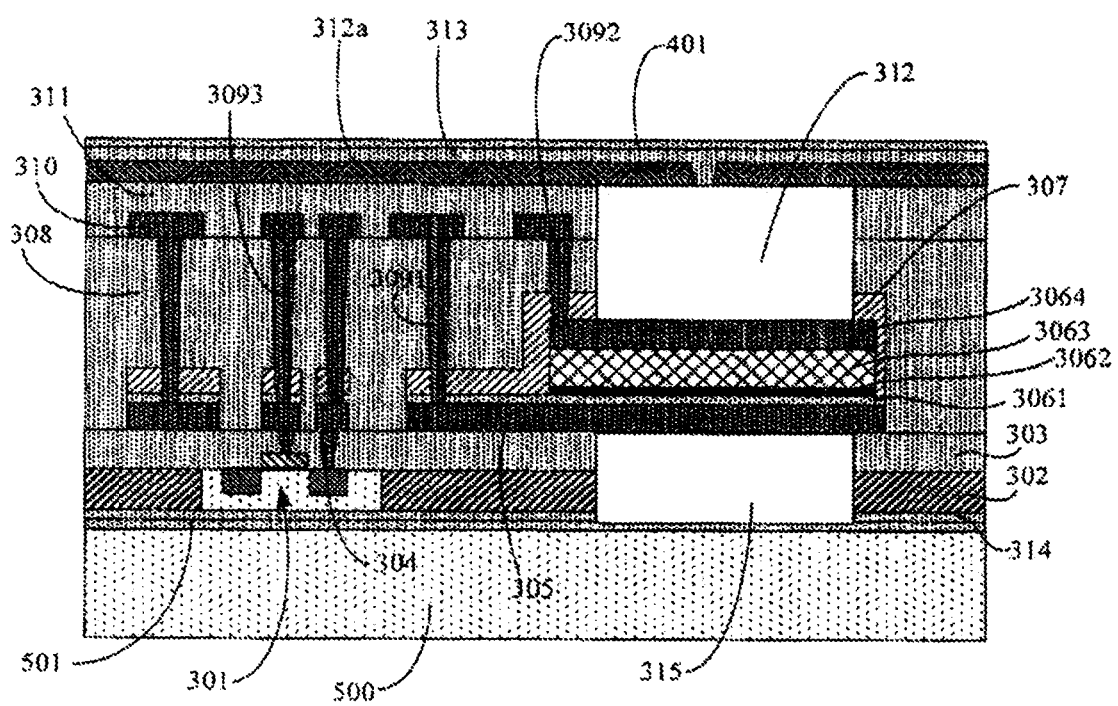
Fig. 3N1
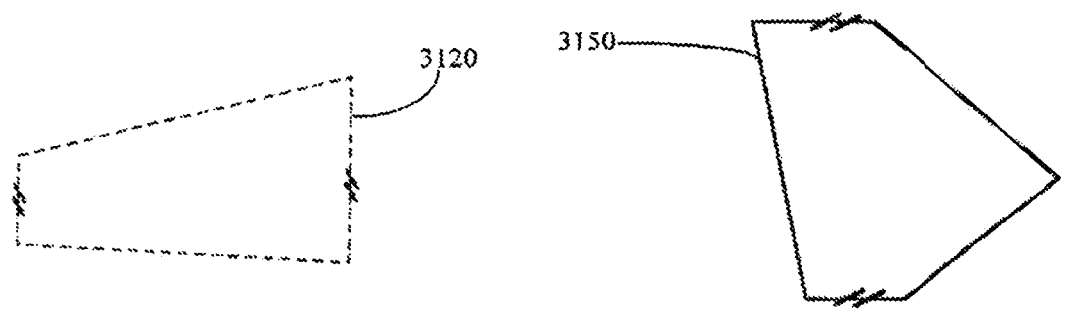
Fig. 3N2
Fig. 3N3

THIN-FILM BULK ACOUSTIC RESONATOR AND SEMICONDUCTOR APPARATUS COMPRISING THE SAME

CROSS REFERENCE TO RELATED APPLICATIONS

This application is a divisional of U.S. patent application Ser. No. 15/416,828, filed on Jan. 26, 2017, which claims priority to and benefit of Chinese Patent Application No. 201610135996.6 filed on Mar. 10, 2016, which is incorporated herein by reference in its entirety.

BACKGROUND

(a) Field of the Invention

The present inventive concept relates to a film bulk acoustic resonator, a semiconductor apparatus including the film bulk acoustic resonator, and manufacturing methods thereof.

(b) Description of the Related Art

Thin-film Bulk Acoustic Resonator (FBAR) is a micro-electro-mechanical (MEMS) based radio frequency (RF) device that has been widely used in wireless devices such as cell phone. FBAR device offers high signal sensitivity, wide frequency response spectrum, and good output linearity. It also has a small footprint and can be integrated into existing complementary metal-oxide-semiconductor (CMOS) fabrication process.

FIG. 1 depicts an example of a conventional FBAR In manufacturing the structure of FIG. 1, a cavity 101 is first formed in a substrate 100, then the cavity 101 is filled with a sacrificial material (not shown). Then a lower electrode layer 102, an acoustic resonator film 103, and an upper electrode layer 104 are formed, respectively, on the substrate 100 and the sacrificial material. The acoustic resonator film 103 may comprise a piezoelectric film, one or more adhesive layer, and one or more dielectric layer. In order to remove the sacrificial material now buried underneath the lower electrode layer 102, a hole 105 has to be made to penetrate the upper electrode layer 104, the acoustic resonance film 103, and the lower electrode layer 102, respectively, to reach the sacrificial material. The sacrificial material then can be removed by a wet etching process through the hole 105. The hole 105 has some undesirable effects in that it weakens the integrity of the lower electrode layer 102, the acoustic resonance film 103, and the upper electrode layer 104, adversely affecting the performance of the FBAR. Therefore a new acoustic resonator design that eliminates the need for the hole 105 is desired.

SUMMARY

This summary is related to some of many embodiments of the inventive concept disclosed herein and is not intended to limit the scope of this inventive concept.

A thin-film bulk acoustic resonator (FBAR) apparatus, comprising:
a lower dielectric layer including a first cavity;
an upper dielectric layer including a second cavity, wherein the upper dielectric layer is on the lower dielectric layer; and
an acoustic resonance film that is positioned between and separating the first and the second cavities, wherein the acoustic, resonance film includes a lower electrode layer, an upper electrode layer, and a piezoelectric film that is sandwiched between the lower and upper electrode layers, and wherein in a plan view of the first and the second cavities overlap to form an overlapped region having a polygonal shape without parallel sides.

Additionally, the first cavity has a shape of a first polygon having at least one pair of parallel sides in plan view.

Additionally, the second cavity has a shape of a second polygon having at least one pair of parallel sides in plan view.

Additionally, the acoustic resonance film further comprises:
an adhesive layer that is positional between the piezoelectric film and the lower electrode layer; and
one or more insulation layers positioned in one or both of: between the adhesive layer and the lower electrode layer, and between the piezoelectric film and the upper electrode layer.

The present inventive concept further presents a semiconductor apparatus comprising:
an isolation trench layer;
a first dielectric layer formed on the isolation trench layer;
a lower electrode layer formed on the first dielectric layer, wherein the lower electrode layer is above the isolation trench layer;
a piezoelectric film formed on the lower electrode layer;
an upper electrode layer formed on the piezoelectric film;
a protection layer formed to cover the side and upper surfaces of the upper electrode layer, the side surface of the piezoelectric film, and part of the upper surface of the lower electrode layer;
a second dielectric layer formed on the first dielectric layer and the protection layer;
a third dielectric layer formed on the second dielectric layer;
a first cavity formed above the isolation trench layer, the first cavity being an enclosed structure extending through the third dielectric layer, the second dielectric layer, and the protection layer, to the upper electrode layer and having a first polygonal shape in plan view;
a fourth dielectric layer formed under the isolation trench layer;
a second cavity formed under the piezoelectric film, the second cavity being an enclosed structure extending through the fourth dielectric layer, the isolation trench layer, and the first dielectric layer to part of the lower electrode layer and having a second polygonal shape in plan view, wherein the first and second cavities are facing each other, their plan views overlap to form an overlapped region having a shape of a third polygon without parallel sides; and
an acoustic resonance film comprising, of the lower electrode layer, the piezoelectric film, and the upper electrode layer.

Additionally, in the aforementioned semiconductor apparatus, a first bonding layer bonds with the third dielectric layer to seal tie first cavity.

Additionally, the aforementioned semiconductor apparatus further comprises:
a first cover layer positioned between the first bonding layer and the third dielectric layer and sealing the first cavity;
at least one first release hole formed in the portion of the first cover layer that is facing the first cavity, the first release hole extending through the first cover layer to the first cavity; and
a first filling material in the first release hole.

Additionally, in the aforementioned semiconductor apparatus, the first bonding layer is formed on a first assistant substrate.

Additionally, in the aforementioned semiconductor apparatus, a second bonding layer is formed on a second assistant substrate and bonded with the fourth dielectric layer to seal the second cavity.

Additionally,: the aforementioned semiconductor apparatus further comprises:

a second cover layer formed on the fourth dielectric layer, the second cover layer sealing the second cavity;

a fifth dielectric layer formed on the second cover layer;

at least one second release hole formed in the portion of the second cover layer and the fifth dielectric layer that is facing the second cavity; and a second idling material in the second release hole.

Additionally, the aforementioned semiconductor apparatus further comprises:

a transistor positioned outside the isolation trench layer and covered by the first dielectric layer; and patternized first metal connecting layer formed on the first dielectric layer and having a first portion and a second portion, wherein the first portion is electrically connected to the transistor, and the second portion that is on the isolation trench layer is the lower electrode layer and is not electrically connected to the transistor.

Additionally, the acoustic resonance film in the aforementioned semiconductor apparatus further comprises:

an adhesive layer positioned between the piezoelectric film and the lower electrode layer; and one or more insulation layer positioned in at least one of: between the lower electrode layer and the adhesive layer, and between the upper electrode layer and the piezoelectric film.

This inventive concept further presents a method for manufacturing a semiconductor apparatus, comprising:

providing a base substrate;

forming an isolation trench layer on the base substrate;

forming a first dielectric layer on the isolation trench layer;

forming a first metal connecting layer on the first dielectric layer;

forming a piezoelectric film on the first metal connecting layer;

forming an upper electrode layer on the piezoelectric film;

patternizing the piezoelectric film and the upper electrode layer, retain the portion of the piezoelectric film and the upper electrode layer that is above the isolation trench layer;

forming a protection layer to cover the side and upper surfaces of the upper electrode layer, the side surface of the piezoelectric film, and part of the upper surface of the lower electrode layer;

patternizing the first metal connecting layer, a portion of the patternized first metal connecting layer that is underneath the piezoelectric film and on the isolation trench layer is used as a lower electrode layer. An acoustic resonance film comprises the lower electrode layer, the piezoelectric film, and the upper electrode layer;

forming a second dielectric layer above the base substrate;

forming a third dielectric layer on the second dielectric layer;

forming a first cavity by etching through the third dielectric layer, the second dielectric layer, and the protection layer wherein the first cavity has a shape of a first polygon in plan view;

sealing the first cavity;

removing part of the base substrate to expose part of the isolation trench layer;

forming a fourth dielectric layer under the isolation trench layer;

forming a second cavity by etching through the fourth dielectric layer, the isolation trench layer, and the first dielectric layer to expose part of the lower electrode layer, wherein the second cavity is facing the first cavity and has a shape of a second polygon in plan view, and wherein the plan views of the first and the second cavities overlap to form an overlapped region having a shape of a third polygon without parallel sides; and sealing the second cavity.

Additionally, in the aforementioned method, the method to seal the first cavity comprises:

providing a first assistant substrate;

forming a first bonding layer on the first assistant substrate; and bonding the first bonding layer with the third dielectric layer to seal the first cavity.

Additionally, in the aforementioned method, the method to seal the first cavity comprises:

filling the first cavity with a first sacrificial material;

forming a first cover layer to cover the third dielectric layer and the first sacrificial material;

forming at least one first release hole in the portion of the first cover layer that is on top of the first sacrificial material;

removing the first sacrificial material through the first release hole; and sealing the first release hole with a first filling material.

Additionally, in the aforementioned method, the method to seal the second cavity comprises:

providing a second assistant substrate;

forming a second bonding layer on the second assistant substrate; and bonding the second bonding layer with the fourth dielectric layer to seal the second cavity.

Additionally, in the aforementioned method, the method to seal the second cavity comprises:

filling the second cavity with a second sacrificial material;

forming a second cover layer to cover the fourth dielectric layer and the second sacrificial material;

forming a fifth dielectric layer on the surface of the second cover layer;

forming at least one second release hole, the second release hole goes through the fifth dielectric layer and the second cover layer, respectively, to reach the second sacrificial material;

removing the second sacrificial material through the second release hole; and sealing the second release hole with a second filling material.

Additionally, in the aforementioned method, a transistor is formed outside the isolation trench layer, the first dielectric layer covers the transistor. A first contact hole is formed in the first dielectric layer, the transistor is electrically connected to part of the first metal connecting layer through the first contact hole.

Additionally, in the aforementioned method, after the second dielectric layer has been formed but before the third dielectric layer is formed, additional steps comprise:

forming a second contact hole that is electrically connected to the lower electrode layer;

forming a third contact bole that is electrically connected to the upper electrode layer;

forming a fourth contact hole that is electrically connected to the transistor;

forming a patternized second metal connecting layer on the second dielectric layer, different portions of the second metal connecting layer are electrically connected to the second, the third and the fourth contact hole, respectively; and forming the third dielectric layer to cover the second dielectric layer and the patternized second metal connecting layer.

Additionally, in the aforementioned method, after the second cover layer has been formed but before the fifth dielectric layer is formed, additional steps comprise:

forming a fifth contact hole that goes through the second cover layer, the fourth dielectric layer, the isolation trench layer, and the first dielectric layer, respectively, to electrically connect to the lower electrode layer;

forming a patternized third metal connecting layer on the second cover layer, the third metal connecting layer is electrically connected to the fifth contact hole.

This summary shows that the FBAR of the present inventive concept comprises a continuous acoustic resonance film that completely separates the first and the second cavities. There is no through-hole in the acoustic resonance film, therefore the FBAR, and the semiconductor apparatus comprising of such a FBAR, can offer better resonance performance.

Further details of the inventive concept and its embodiments are described below with reference to the attached drawing figures.

BRIEF DESCRIPTION OF THE DRAWINGS

FIGS. 3A, 3B, 3C, 3D, 3E, 3F1, 3G, 3H, 3I, 3J, 3K, 3L1, 3M, 3N1, 3O, and 3P show schematic diagrams (e.g., schematic cross-sectional views) that illustrate the elements and/or structures formed in a method for manufacturing a semiconductor apparatus in accordance with one or more embodiments of the inventive concept.

FIGS. 3F2, 3L2, 3N2, and 3N3 show the top plan view of the first or the second cavity in a method for manufacturing a semiconductor apparatus in accordance with one or more embodiments of the inventive concept.

DETAILED DESCRIPTION OF THE EMBODIMENTS

Figure 1:
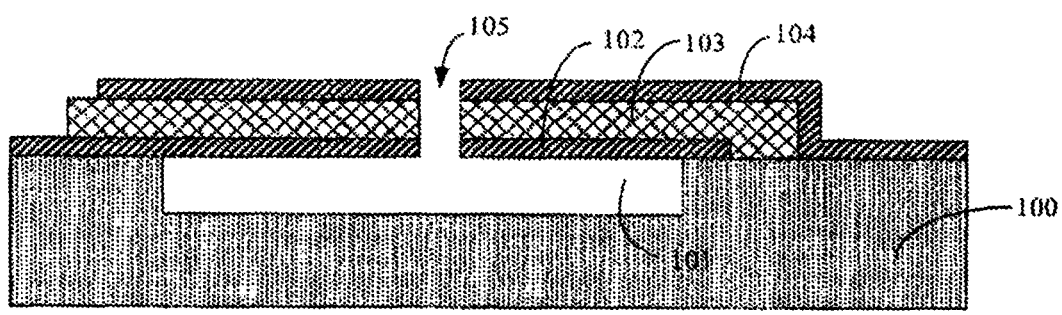
FIG. 1 (Prior Art) shows a schematic diagram (e.g., a schematic cross-sectional view) that illustrates a FBAR in prior art.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

A First Embodiment

Figure 2A:
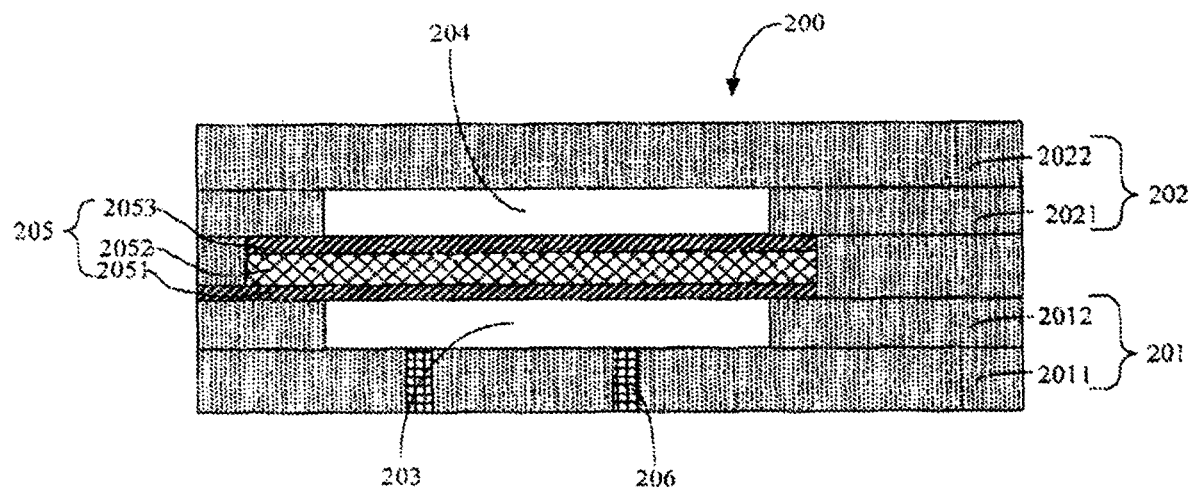
FIG. 2A shows a schematic diagram (e.g., a schematic cross-sectional view) that illustrates a FBAR in accordance with one of the embodiments of the inventive concept.
Figure 2B:
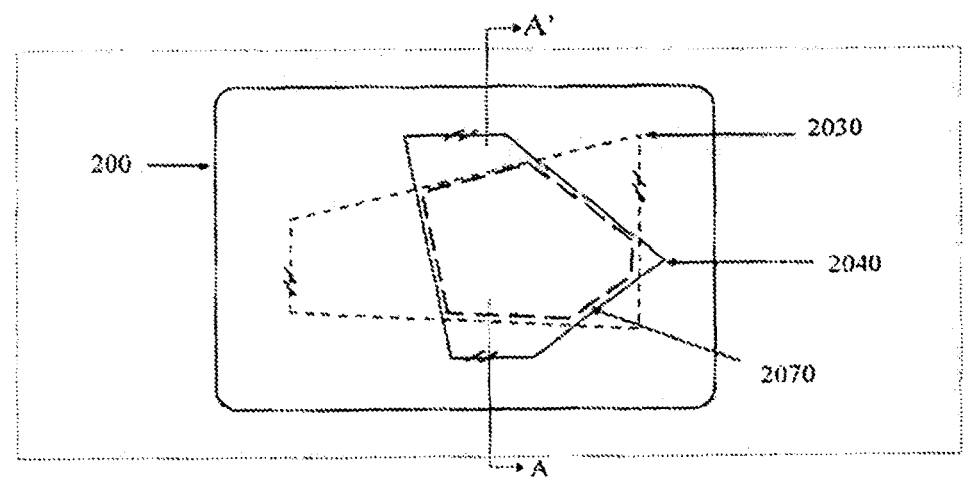
FIG. 2B shows a top plan view of the first and the second cavities in FIG. 2A.

FIGS. 2A and 2B illustrate a FBAR device in accordance with one embodiment FIG. 2A shows a schematic cross-sectional view of the FBAR device; FIG. 2B shows a top plan view of tine first and the second cavities in FIG. 2A.

As illustrated in FIG. 2A, the FBAR device 200 comprises the following elements: a lower dielectric layer 201, wherein there is a first cavity 203 inside the lower dielectric layer 201. As illustrated in FIG. 2B, the top plan view of the first cavity 203 is a first polygon 2030, the first polygon 2030 has at least one pair of parallel sides, which may facilitate the measurement and control during the micro-fabrication process. The first cavity 203 may have exactly the same profiles in thickness direction.

The top plan view in FIG. 2B is obtained by observing the corresponding element in the schematic diagram of FIG. 2A looking down from the "top" of FIG. 2A. In this application, the "top plan view" of an element in a schematic diagram refers to the view obtained by observing that element in thickness direction from the top.

The lower dielectric layer 201 may comprise multiple dielectric layers. For example, it may comprise a first dielectric layer 2011 and a second dielectric layer 2012. The second dielectric layer 2012 is on the first dielectric layer 2011. The first cavity 203 is inside the second dielectric layer 2012 and is sealed by the first dielectric layer 2011 at one end.

Optionally, one or more first release hole(s) can be formed on the portion of the first dielectric layer 2011 that is facing the first cavity 203. The first release hole(s) may be filled with a sealing material 206. The number of the first release hole can be determined based on the requirements in the manufacturing process, and may be, for example, one, two, or three.

The lower dielectric layer 201 can be made of materials including, but not limited to, silicon-based oxide or nitride, such as silicon dioxide ($SiO_2$), carbon-fluorine compound (CF), carbon-doped silicon oxide (SiOC), silicon nitride (SiN), or silicon carbonitride (SiCN). Alternatively, the lower dielectric layer 201 may also be made of carbon-fluorine compounds comprising of carbonitride (SiCN) film. The major components of the carbon-fluorine compound are fluorine (F) and carbon (C). The carbon-fluorine compounds can also be made of non-crystalline materials.

The sealing material 206 may be any scaling material that is well known to a person having ordinary skill in the art in this area. For example, it can be silicon dioxide ($SiO_2$). The settling material 206 may also be the same material that has been used for the first dielectric layer 2011 or the second dielectric layer 2012.

The FBAR of the inventive concept may further comprise an upper dielectric layer 202, wherein the upper dielectric layer 202 has a second cavity 204 that is facing the first cavity 203.

In one embodiment, the upper dielectric layer 202 is on the lower dielectric layer 201. The upper dielectric layer 202 may comprise multiple dielectric layers. For example, it may comprise a third dielectric layer 2021 and a fourth dielectric layer 2022, wherein the fourth dielectric layer 2022 is on the third dielectric layer 2021. The second cavity 204 is inside the third dielectric layer 2021 and is sealed by the fourth dielectric layer 2022 at one end.

The upper dielectric layer 202 and the lower dielectric layer 201 may be made of the same material. For example, they may both be made of silicon oxide. The upper dielectric layer 202 and the lower dielectric layer 201 may also be made of different dielectric materials.

One or more second release hole (not shown) may be formed on the portion of the upper dielectric layer 202 that is on top of the second cavity 204. The second release hole may be filled with the sealing material 206.

As illustrated in FIG. 2B, the top plan view of the second cavity 204 is a second polygon 2040, which has at least one pair of parallel sides that may facilitate the measurement and control during the micro-fabrication process. The second cavity 204 may have the same profiles in thickness direction.

As illustrated in FIG. 2A and 2B, in one embodiment, the first cavity 203 is facing the second cavity 204, the top plan views of the first cavity 203 and the second cavity 204 are the first polygon 2030 and the second polygon 2040, respectively. Each of the two polygons can be any polygon. For example, it can be a quadrilateral, a pentagon, or a hexagon. The top plan views of the first and the second cavities will have an overlapped region, which forms a third polygon 2070, the third polygon 2070 may be any polygon. For example, it can be a quadrilateral, a pentagon, a hexagon, a heptagon, or an octagon. The third polygon 2070 does not have any parallel sides.

In one embodiment, the FBAR of the inventive concept may further comprise an acoustic resonance film 205 that is placed between the first cavity 203 and the second cavity 204. The acoustic resonance film 205 continuously separates the first cavity 203 and the second cavity 204. Part of the acoustic resonance film 205 is directly coupled with the lower dielectric layer 201 or the upper dielectric layer 202, sealing the first cavity 203 and the second cavity 204, respectively. The acoustic resonance film 205 is a continuous film without any through-hole or filling material that may disrupt its integrity.

The acoustic resonance film 205 may comprise a lower electrode layer 2051, a piezoelectric film 2052, and an upper electrode layer 2053, wherein the piezoelectric film 2052 is sandwiched by the lower electrode layer 2051 and the upper electrode layer 2053.

The piezoelectric film 2052 may be made of piezoelectric materials with wurtzite crystal structure, such as zinc oxide (ZnO), aluminum nitride (AlN), or gallium nitride (GaN). In this embodiment, the piezoelectric film 2052 is made of aluminum nitride (AlN).

The thickness of the piezoelectric film 2052 may be chosen based on the target resonance frequency or wavelength, and can be optimally set at half of the target resonance wavelength.

The lower electrode layer 2051 may be made of a conductive or semiconductor material. The conductive material may be one or more metals such as aluminum (Al), copper (Cu) platinum (Pt), gold (Au), iridium (Ir), osmium (Os), rhenium (Re), palladium (Pd), rhodium (Rh), or ruthenium (Ru). The conductive material may also be molybdenum (Mo) film or tungsten (W) film. The lower electrode layer 2051 may also be made of any suitable semiconductor material such as silicon (Si), germanium (Ge), silicon-germanium (SiGe), silicon carbide (SiC), or silicon-germanium-carbon compound (e.g. SiGeC). The thickness of the lower electrode layer 2051 may be chosen based on the target resonance frequency or wavelength. For example, it may be optimally set at 1/10 of the target resonance wavelength.

The upper electrode layer 2053 may be made of a conductive or semiconductor material. The conductive material may be one or more metals such as aluminum (Al), copper (Cu), gold (Au), platinum (Pt), or copper alloys. The semiconductor material may be silicon (Si), germanium (Ge), silicon-germanium (SiGe), silicon carbide (SiC), or silicon-germanium-carbon compound (e.g., SiGeC). The thickness of the upper electrode layer 2053 may be chosen based on the target resonance frequency or wavelength. For example, it may be optimally set at 1/10 of the target resonance wavelength.

To achieve a tight contact between the piezoelectric film 2052 and the lower electrode layer 2051, an adhesive layer (not shown) may be optionally placed between the piezoelectric film 2052 and the lower electrode layer 2051. The adhesive layer may be made of crystals with wurtzite crystal structure. In this embodiment, the adhesive layer is made of molybdenum (Mo).

In one embodiment, an insulation layer can be placed between the lower electrode layer 2051 and the piezoelectric film 2052. For example, an insulation layer can be placed between the lower electrode layer 2051 and the adhesive layer. Optionally, an insulation layer may also be placed between the upper electrode layer 2053 and the piezoelectric film 2052. The insulation layer may be made of silicon-based oxide or nitride, such as silicon oxide, silicon nitride, or inorganic material in silicon oxynitride. In this embodiment, the insulation layer is made of silicon oxide.

Further, additional protection layer (not shown) may be formed to cover the upper surface of the electrode layer 2053 that is outside the second cavity 204, part of the upper surface or the lower electrode layer 2051, and the side surface of the upper electrode layer 2053 and the piezoelectric film 2052.

The protection layer may be made of silicon-based oxide, nitride, or oxynitride, it may also be made of the same material that has been used for any aforementioned dielectric layer, or any other dielectric material that is well known to a person having ordinary skill in the art in this area.

The FBAR in the inventive concept may further comprise one or more contact hole(s) (not shown) in the lower electrode layer 2051 and the upper electrode layer 2053. Two metal connecting layers (not shown)—one connects to the contact hole(s) in the lower electrode layer 2051, the other connects to the contact hole(s) in the upper electrode layer 2053—may be formed. These two metal connecting layers provide electrical connection to the lower electrode layer 2051 and the upper electrode layer 2053, respectively. There may be additional dielectric, layer(s) above or beneath the metal connecting layers.

Additionally, contact hole may also be formed in both the lower dielectric 201 and the upper dielectric layer 202 to establish electrical connection to the lower electrode layer 2051.

As described above the FBAR in the inventive concept comprises a continuous acoustic resonance film 205 that completely separates the first cavity 203 and the second cavity 204. As there is no through-hole in the acoustic resonance film 205, the FBAR can offer better resonance performance.

A Second Embodiment

Figure 3A:
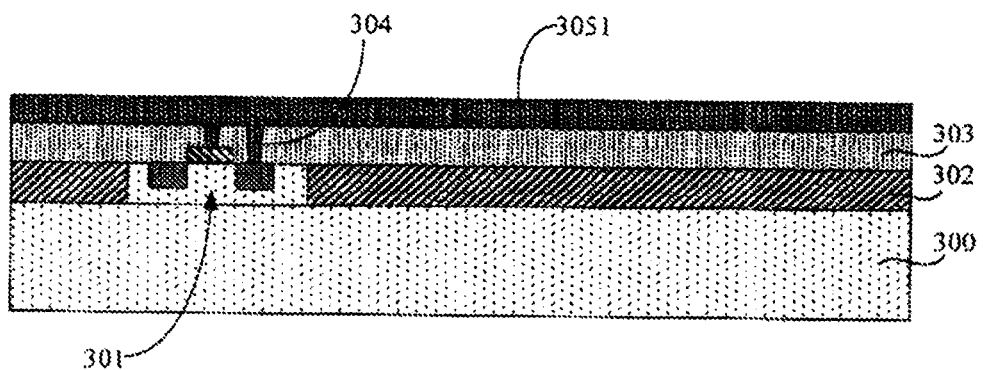
Figure 3B:
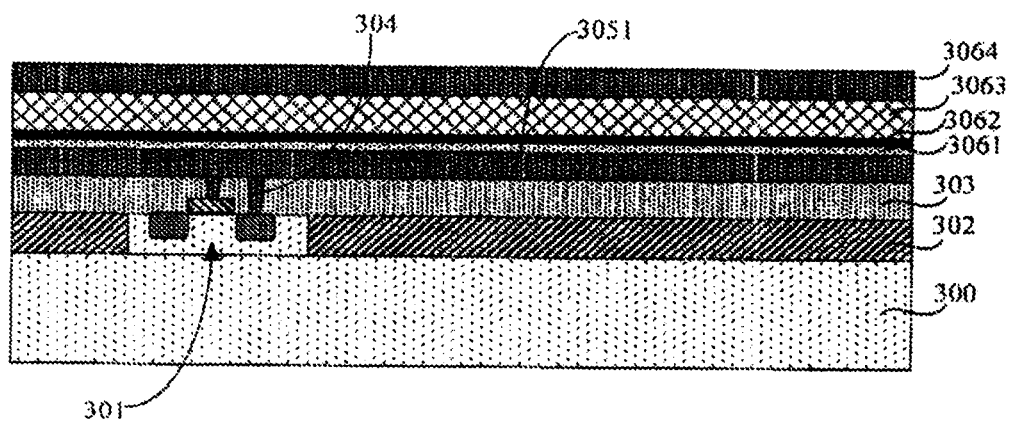
Figure 3C:
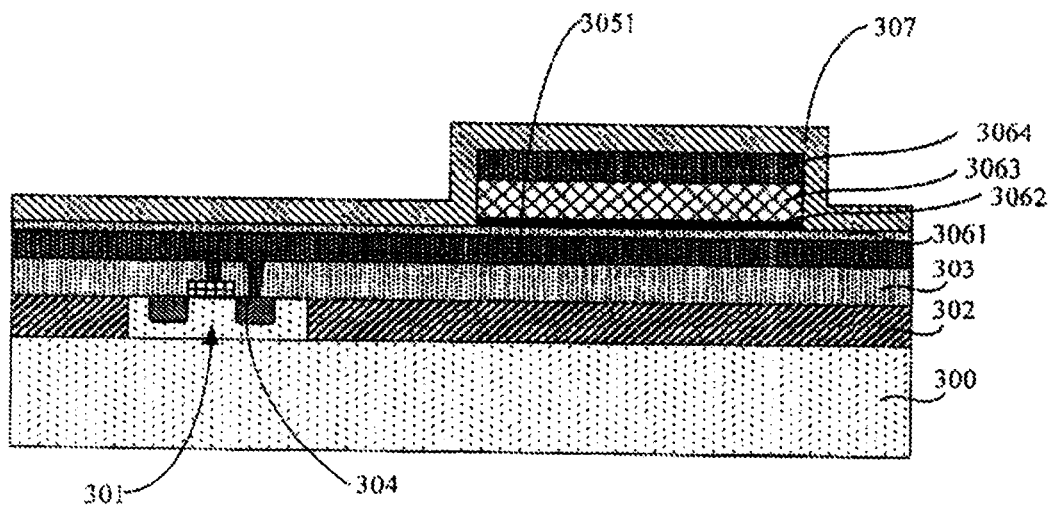
Figure 3D:
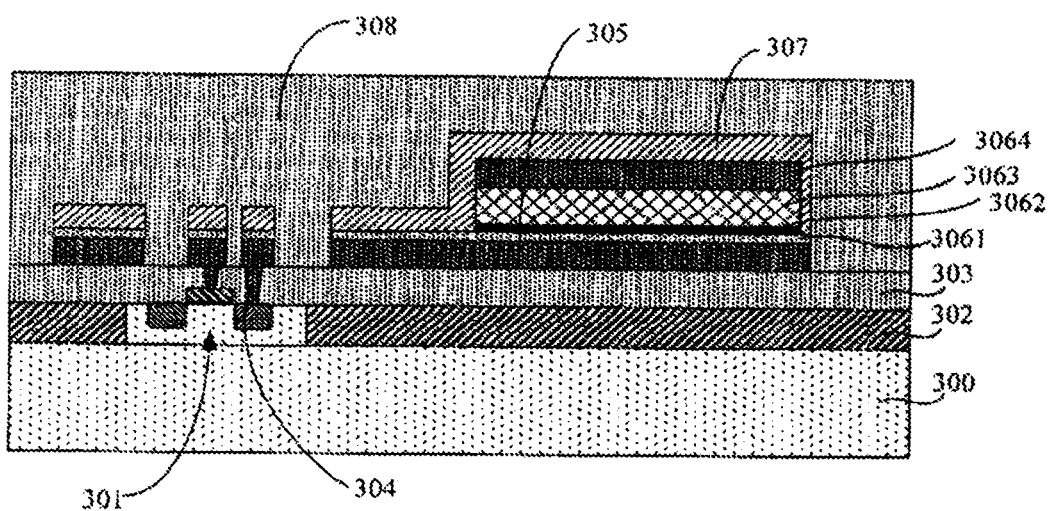
Figure 3G:
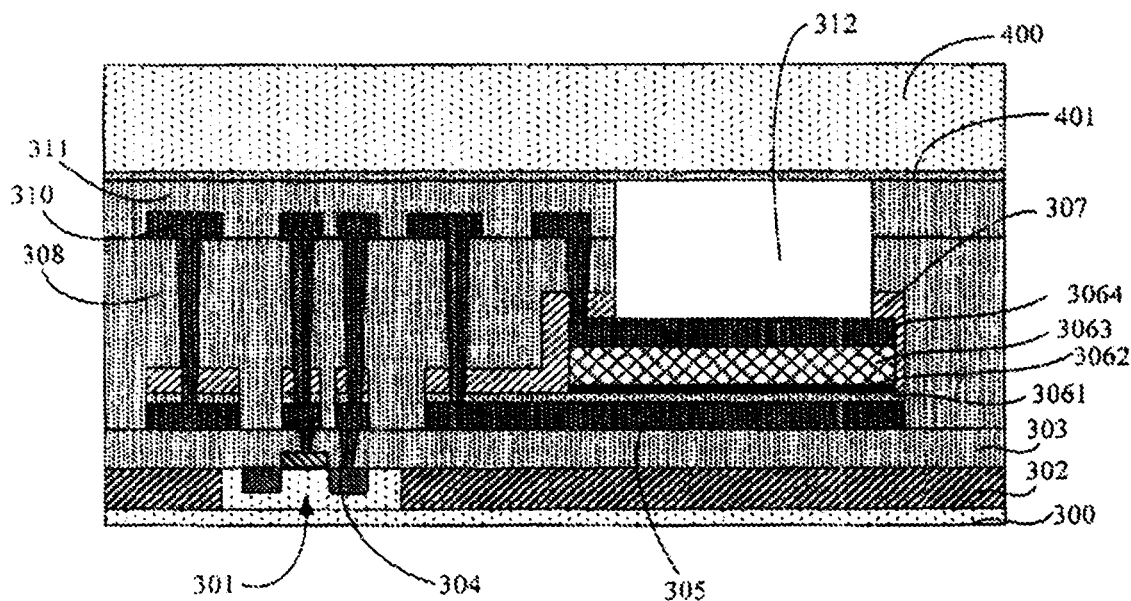
Figure 3H:
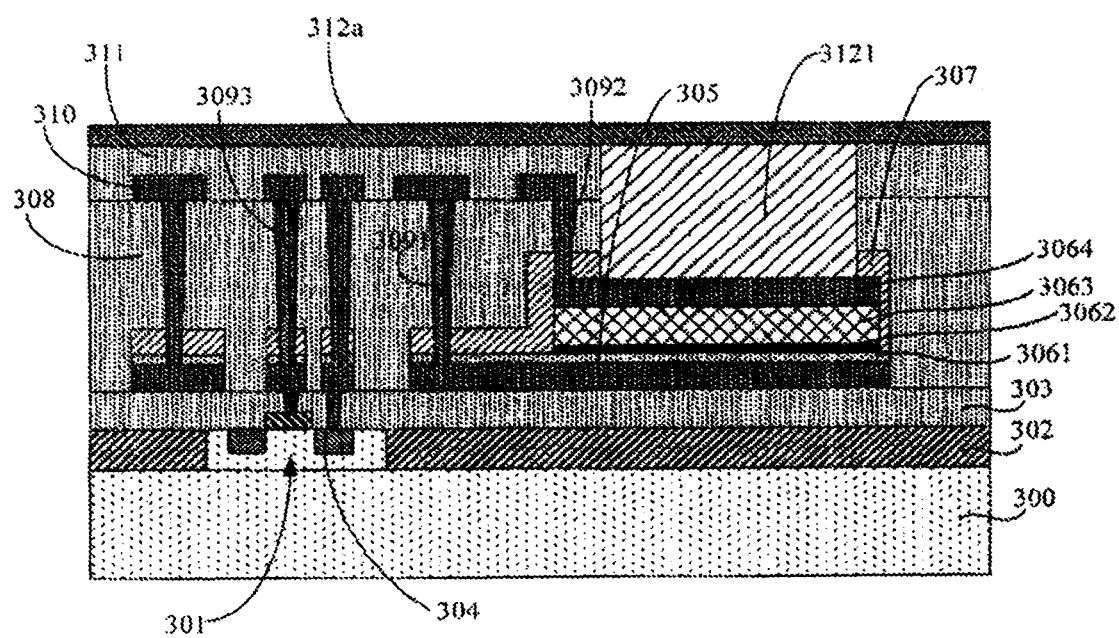
Figure 3I:
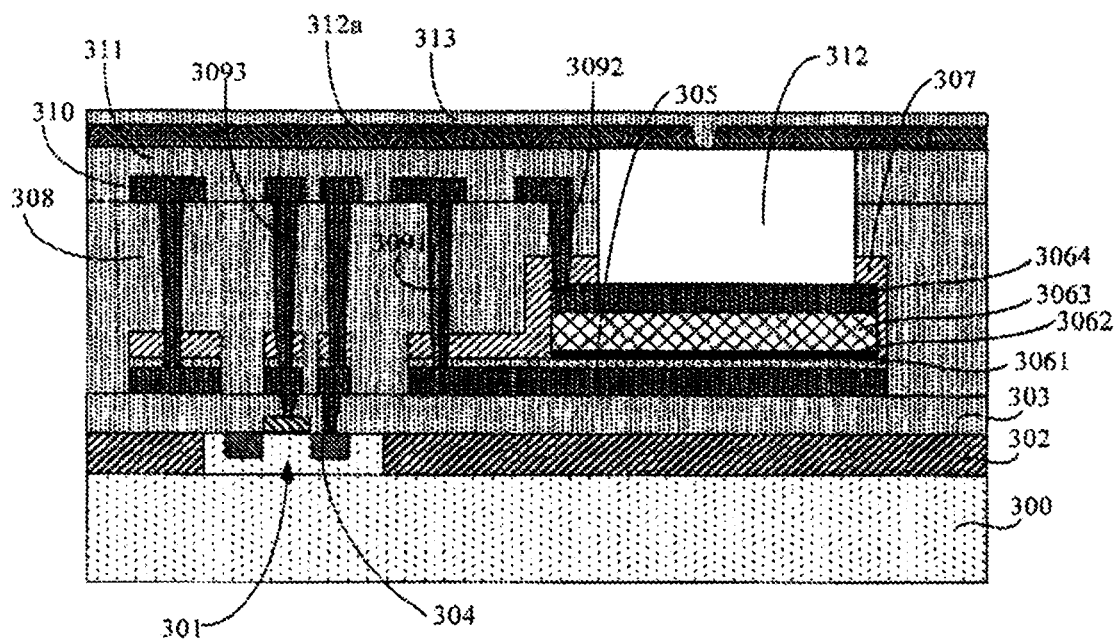
Figure 3J:
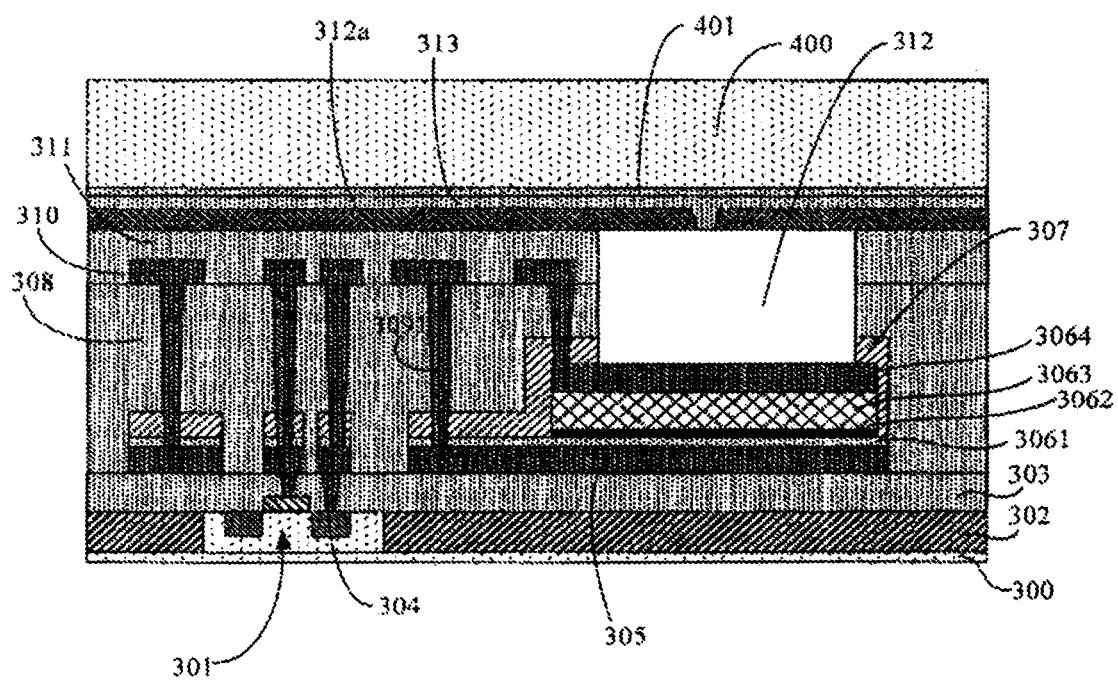
Figure 3K:
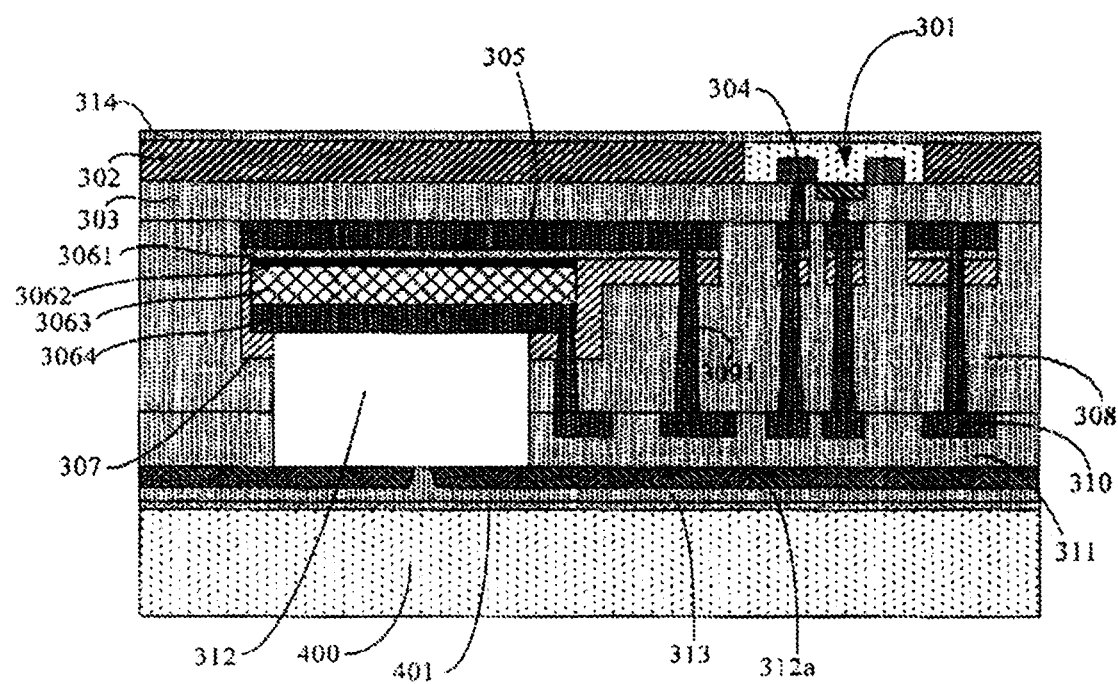
Figure 3M:
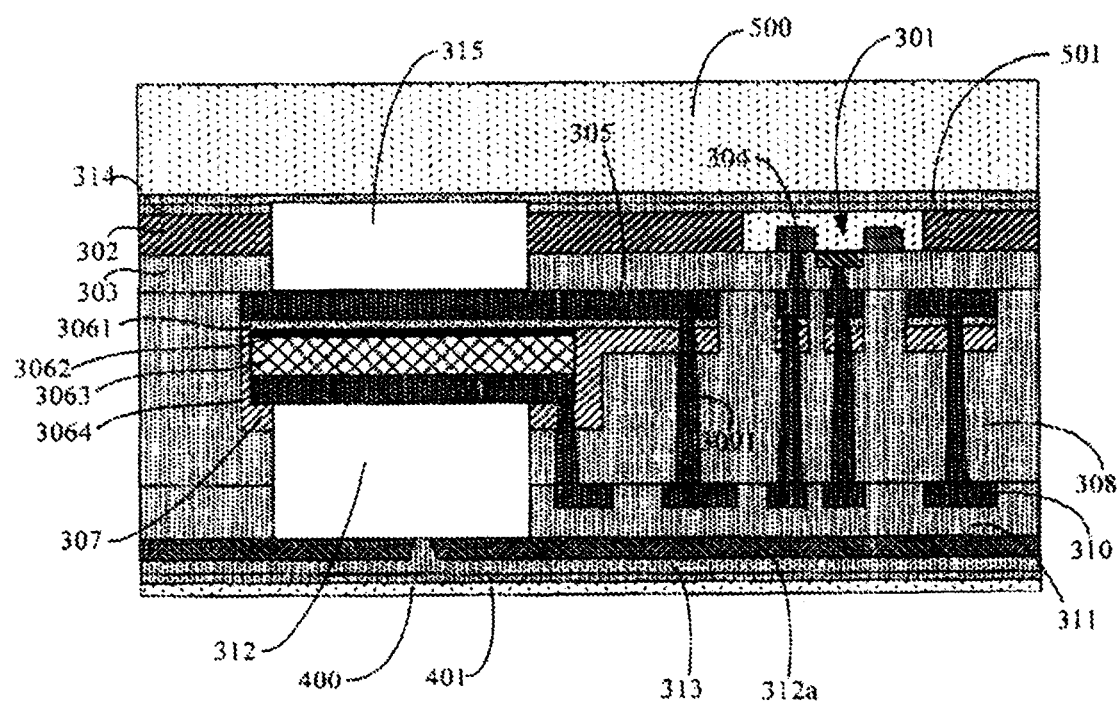
Figure 3O:
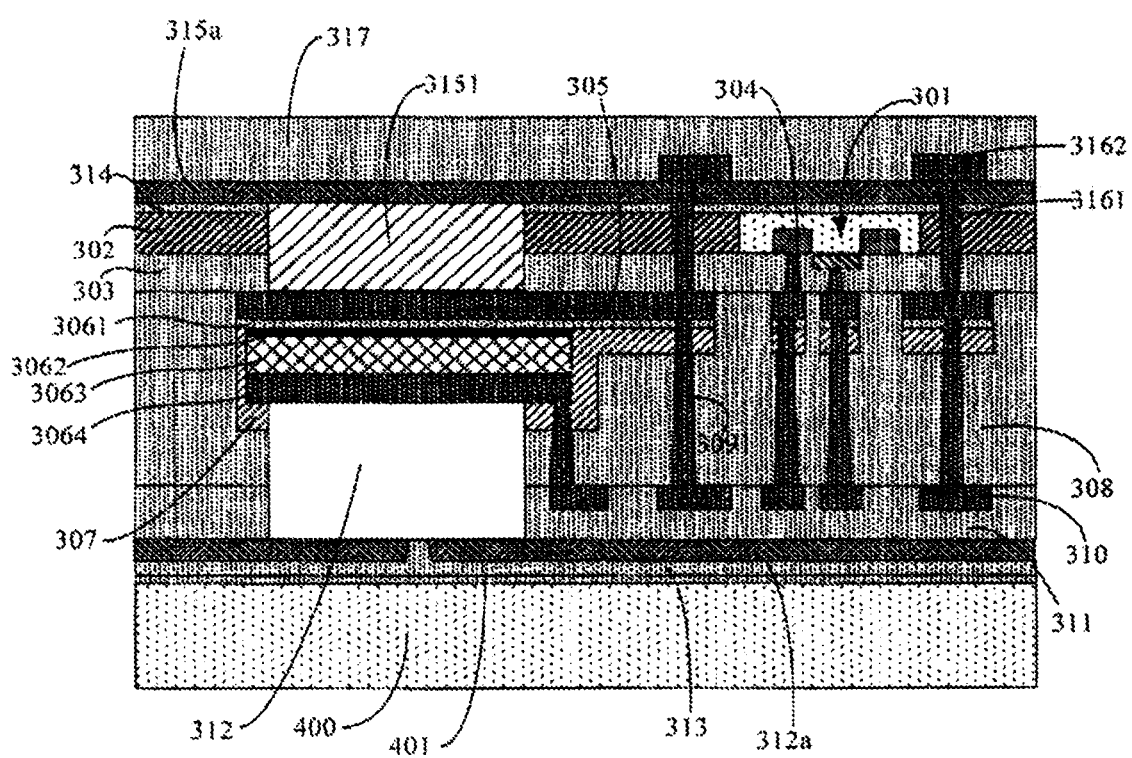
Figure 3P:
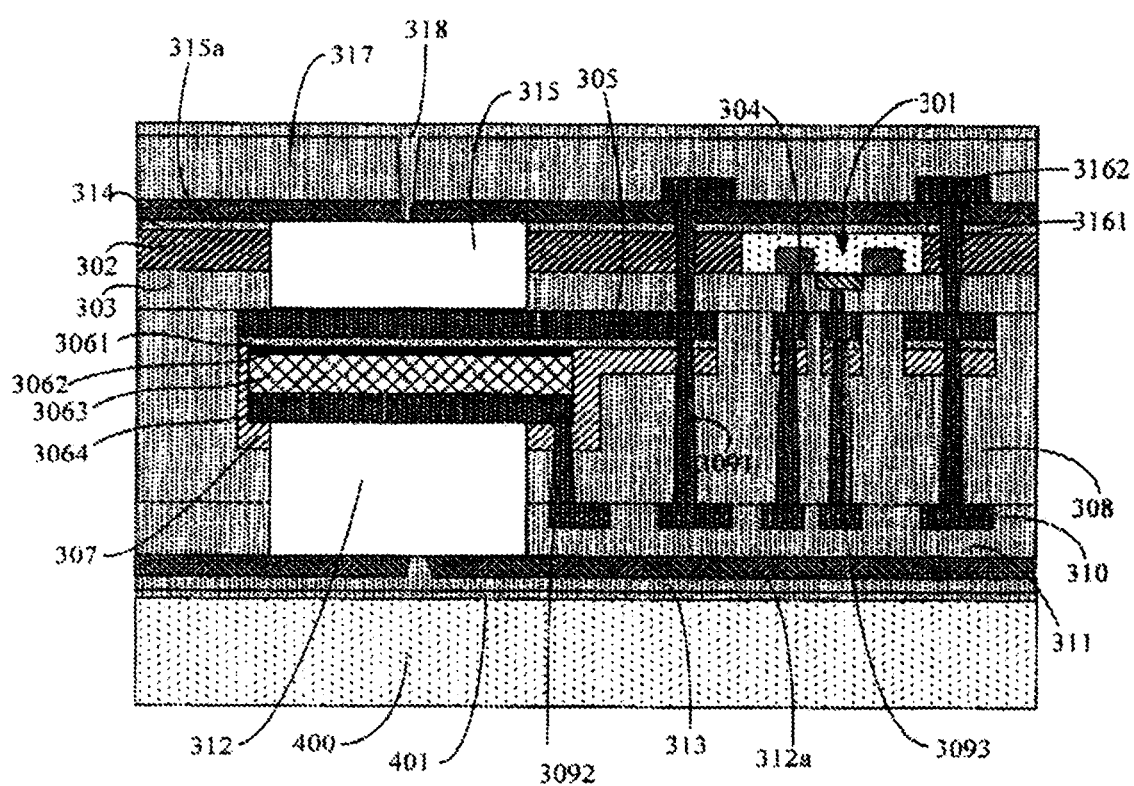

FIGS. 3N1 and 3P depict another embodiment of the semiconductor apparatus in accordance with this inventive concept.

Referring to FIG. 3N1, as an example, the semiconductor apparatus in the inventive concept may comprise an isolation trench layer 302 and a first dielectric layer 303 on the isolation trench layer 302. The isolation trench layer 302 may be filled with a filling material such as silicon-based oxide, nitride, or oxynitride.

The first dielectric layer 303 may be made of materials such as silicon-based oxide or nitride. For example, it may be made of silicon dioxide ($SiO_2$), carbon-fluorine compound (CF), carbon-doped silicon oxide (SiOC), silicon nitride (SiN), or silicon carbonitride (SiCN). Alternatively, the first dielectric layer 303 may also be made of carbon-fluorine compounds comprising of carbonitride (SiCN) film. The major components of the carbon-fluorine compound are fluorine (F) and carbon (C). The carbon-fluorine compounds may also be made of non-crystalline materials.

Referring to FIG. 3N1, a lower electrode layer 305 may be formed on the first dielectric layer 303. The lower electrode layer 305 may be made of a conductive or semiconductor material. The conductive material may be one or more metals such as aluminum (Al), copper (Cu), platinum (Pt), gold (Au), iridium (Ir), osmium (Os), rhenium (Re), palladium (Pd), rhodium (Rh), or ruthenium (Ru). The conductive metal may also be molybdenum (Mo) film or tungsten (W) film. The lower electrode layer 305 may also be made of any suitable semiconductor material such as silicon (Si), germanium (Ge), silicon-germanium (SiGe), silicon carbide (SiC), or silicon-germanium-carbon compound (e.g. SiGeC).

The thickness of the lower electrode aver 305 may be chosen based on the target resonance frequency or wavelength. For example, it may be set at 1/10 of the target resonance wavelength.

In one embodiment, a transistor 301 may be formed outside the isolation trench layer 302. The transistor 301 is formed before the first dielectric layer 303 is formed and is covered by the first dielectric layer 303. Additionally, several first contact holes 304 may be formed in the first dielectric layer 303. The first contact holes 304 go through the first dielectric layer 303 to electrically connect to the transistor 301. A patternized first metal connecting layer may be formed on the first dielectric layer 303, a portion of the first metal connecting layer is electrically connected to the first contact holes 304. Another portion of the first metal connecting layer that is on top of the isolation trench layer 302 may be used as the lower electrode layer 305, this portion is not electrically connected to the first contact holes 304.

The transistor 301 may be any semiconductor device that is well known to a person having ordinary skill in the art, such as Metal-Oxide-Semiconductor (MOS) transistor, or Complementary Metal-Oxide-Semiconductor (CMOS) transistor. The transistor 301 may also comprise the gate, source and drain terminals of the transistor. In this embodiment, several first contact holes 304 are connected to the gate, source, and drain terminals of a MOS transistor, respectively.

Additionally, a piezoelectric film 3063 and an upper electrode layer 3064 may be formed, respectively, on part of the lower electrode layer 305. To facilitate the establishment of the electrical connection of the contact holes that will be formed in succeeding stages, the piezoelectric film 3063 and the upper electrode layer 3064 are horizontally staggered with the lower electrode layer 305.

In one embodiment, to achieve a tight contact between the piezoelectric film 3063 and the lower electrode layer 305, an adhesive layer 3062 may be formed between the piezoelectric film 3063 and the lower electrode layer 305. Additionally, a separation layer 3061 may also be formed between the adhesive layer 3062 and the lower electrode layer 305. The separation layer 3061 may further cover other parts of the patternized first metal connecting layer. Optionally, additional separation layers (not shown) may also be formed between the upper electrode layer 3064 and the piezoelectric film 3063, between the adhesive layer 3062 and the lower electrode layer 305, or between the upper electrode layer 3064 and the piezoelectric film 3063.

The piezoelectric film 3063 may be made of piezoelectric materials with wurtzite crystal structure, such as zinc oxide (ZnO), aluminum nitride (AlN), or gallivant nitride (GaN). In this embodiment, it is made of aluminum nitride (AlN).

The thickness of the piezoelectric film 3063 may be chosen based on the target resonance frequency or wavelength and may be optimally set at half of the target resonance wavelength.

The upper electrode layer 3064 may be made of a conductive or semiconductor material. The conductive material may be a conductive metal such as aluminum (Al), copper (Cu), gold (Au), platinum (Pt), or copper alloys. The semiconductor material may be silicon (Si), germanium (Ge), silicon-germanium (SiGe), silicon carbide (SiC), or silicon-germanium-carbon compound (e.g. SiGeC). The thickness of the upper electrode layer 3064 may be chosen based on the target resonance frequency or wavelength. For example, it may be optimally set at 1/10 of the target resonance wavelength.

The adhesive layer 3062 may be made of crystals with wurtzite crystal structure. In this embodiment, it is made of molybdenum (Mo).

The separation layer 3061 may be made of silicon-based oxide or nitride, such as silicon oxide, silicon nitride, or inorganic material in silicon oxynitride. In this embodiment, it is made of silicon oxide.

An acoustic resonance film may comprise the lower electrode layer 305, the separation layer 3061, the adhesive layer 3062, the piezoelectric layer 3063, and the upper electrode layer 3064. The acoustic resonance film may further comprise additional films or layers to facilitate the operations of actual devices, and the detailed structure of the acoustic resonance film is not limited by this embodiment.

Additionally, a protection layer 307 may be formed to cover the side and upper surfaces of the upper electrode layer 3064, part of the upper surface of the lower electrode layer 305, and the side surface of the piezoelectric film 3063. Referring to FIG. 3N1, in one embodiment, when the separation layer 3061 is formed to cover not only the lower electrode layer 305 but also other parts of the first metal connecting layer, the protection layer 307 will be formed to cover the upper surfaces of all the separation layer 3061.

The protection layer 307 protects the acoustic resonance film, and may be made of silicon-based oxide, nitride, or oxy nitride. It may also be made of the same material that has been used for the first dielectric layer 303, or any other dielectric material that is well known to a person having ordinary skill in the art in this area.

Additionally, a second dielectric layer 308 may be formed on both the protection layer 307 and the first dielectric layer 303 The second dielectric layer 308 completely covers the protection layer 307.

The second dielectric layer 308 may be made of any dielectric material that us well known to a person having ordinary skill in the an in this area. It may be made of materials such as silicon-based oxide or nitride. For example, it may be made of silicon dioxide ($SiO_2$), carbon-fluorine compound (CF), carbon-doped silicon oxide (SiOC), silicon nitride (SiN), or silicon carbonitride (SiCN). Alternatively, the second dielectric layer 308 may also be made of carbon-fluorine compounds comprising of carbo-nitride (SiCN) film. The major components of the carbon-fluorine compound are fluorine (F) and carbon (C). The carbon-fluorine compounds may also be made of non-crystalline materials. The second dielectric layer 308 may also be made of the same material that has been used for the first dielectric layer 303.

Referring to FIG. 3N1, a second contact hole 3091 may be formed to establish electrical connection to the lower electrode layer 305, a third contact hole 3092 may be formed to establish electrical connection to the upper electrode layer 3064, a fourth contact hole 3093 may be formed to establish electrical connection to the transistor 301.

The second contact hole 3091 goes through the second dielectric layer 308, the protection layer 307, and the separation layer 3061, respectively, to electrically connect to the lower electrode layer 305. The third contact hole 3092 goes through part of the second dielectric layer 308, and the protection layer 307, respectively, to electrically connect to the upper electrode layer 3064. The fourth contact hole 3093 goes through the second dielectric layer 308, the protection layer 307, and the separation layer 3061, respectively, to electrically connect to the portion of the first metal connecting layer that is electrically connect to the transistor 301.

A second metal connecting layer 310 may be formed on the second dielectric layer 308. Different portion of the second metal connecting layer 310 is electrically connected to the second contact hole 3091, the third contact hole 3092, and the fourth contact hole 3093, respectively.

Referring to FIG. 3N1, a third dielectric layer 311 may be formed on both the second dielectric layer 308 and the second metal connecting layer 310. The third dielectric layer 311 completely covers the second metal connecting layer 310.

The third dielectric layer 311 may be made of any dielectric material that is well known to a person having ordinary skill in the art in this area. It may be made of materials such as silicon-based oxide or nitride. For example, it may be made of silicon dioxide ($SiO_2$), carbon-fluorine compound (CF), carbon-doped silicon oxide (SiOC), silicon nitride (SiN), or silicon carbonitride (SiCN). Alternatively, the third dielectric layer 311 may also be made of carbon-fluorine compounds comprising of carbonitride (SiCN) film. The major components of the carbon-fluorine compound are fluorine (F) and carbon (C). The carbon-fluorine compounds may also be made of non-crystalline materials. The third dielectric layer 311 may also be made of the same material that has been used for any aforementioned dielectric layer.

Referring to FIG. 3N1, a first cavity 312 may be formed above the piezoelectric film 3063. The first cavity 312 is a sealed structure, it goes through the third dielectric layer 311, the second dielectric layer 308, and the protection layer 307 respectively, and exposes part of the upper surface of the upper electrode layer 3064. The entire first cavity 312 is on top of the upper electrode layer 3064.

Referring to FIG. 3N2, the top plan view of the first cavity 312 is a first polygon 3120. The first polygon 3120 may have at least one pair of parallel sides.

In one embodiment, referring to FIG. 3P, a first bonding layer 401 may be formed on a first assistant substrate 400. The first bonding layer 401 then is bonded with the third dielectric layer 311 to seal the first cavity 312.

In another embodiment, referring to FIG. 3N1, a first cover layer 312a may be formed between the first bonding layer 401 and the third dielectric layer 311. The first cover layer 312a seals the first cavity 312. At least one first release hole may be formed in the first cover layer 312a, the first release hole goes through the portion of the first cover layer 312a that is on top of the first cavity 312. The first release hole is filled and sealed by a first sealing material 313, the first sealing material 313 further covers the upper surface of the first cover layer 312a.

The first bonding layer 401 may be made of silicon-based oxide and bonded with either the third dielectric layer 311 or the first sealing material 313 by melted bonding.

The first assistant substrate 400 works as a supportive foundation, and may be made of any semiconductor substrate material such as silicon, alumina ceramic, quartz, or glass.

The first cover layer 312a may be made of one of many dielectric materials including, but not limited to, oxide, nitride, or oxynitride. For example, it may be made of silicon-based oxide, nitride, carbide, or oxynitride.

The first sealing material 313 may be any sealing material that is well known to a person having ordinary skill in the art in this area, such as silicon dioxide. It may also be the same material that has been used for any aforementioned dielectric layer.

Additionally, referring to FIG. 3N1, a fourth dielectric layer 314 may be formed under the isolation trench layer 302. The fourth dielectric layer 314 also covers the bottom side of the transistor 301. The fourth dielectric layer 314 may be made of any suitable dielectric material that is well known to a person of ordinary skill in the art, such as silicon-based oxide or nitride. It may also made of the same material that has been used for any aforementioned dielectric layer.

Referring to FIG. 3N1, a second cavity 315 may be formed under the piezoelectric film 3063. The second cavity 315 is a sealed structure, it goes through the fourth dielectric layer 314, the isolation trench layer 302, and the first dielectric layer 303, respectively, and exposes at least part of bottom surface of the lower electrode layer 305. The second cavity 315 is facing the first cavity 312.

Referring to FIG. 3N3, the top plan view of the second cavity 315 is a second polygon 3150. The second polygon 3150 may have at least one pair of parallel sides.

In one embodiment, referring to FIG. 3N1, a second bonding layer 501 may be formed on a second assistant substrate 500. The second bonding layer 501 then is bonded with the fourth dielectric layer 314 to seal the second cavity 315.

In another embodiment, referring to FIG. 3P, a second cover layer 315a may be formed on the surface of the fourth dielectric layer 314. The second cover layer 315a seals the second cavity 315. At least one second release hole may be formed in the second cover layer 315a the second release hole goes through the portion of the second cover layer 315a that is facing the second cavity 315. The second release hole is filled and sealed by a second sealing material 318.

The second bonding layer 501 may be made of silicon-based oxide and bonded with the fourth dielectric layer 314 by melted bonding.

The second assistant substrate 500 works as a supportive foundation, it may be made of any semiconductor substrate material such as silicon, alumina ceramic, quartz or glass.

The second cover layer 315a may be made of one of many dielectric materials including, but not limited to, oxide nitride, or oxynitride. For example, it may be made of silicon-based oxide, nitride, carbide, or oxynitride.

The second sealing material 318 may be any sealing material that is well known to a person having ordinary skill in the art in this area, such as silicon dioxide. It may also be the same material that has been used for any aforementioned dielectric layer.

Additionally, referring to FIG. 3P, a third metal connecting, layer 3162 may le formed on the second cover layer 315a. A fifth contact hole 3161 may be formed under the third metal connecting layer 3162. The fifth contact hole 3161 goes through the second cover layer 315a, the fourth dielectric layer 314, the isolation trench layer 302, and the first dielectric layer 303, respectively, to electrically connect to the lower electrode layer 305.

A fifth dielectric layer 317 may be formed to cover both the second cover layer 315a and the third metal connecting layer 3162. Referring to FIG. 3P, the second release hole may further go through the fifth dielectric layer 317, the second sealing material 318 may fill and seal the second release hole and further cover the surface of the fifth dielectric layer 317.

The fifth dielectric layer 317 may be made of any suitable dielectric material that is well known to a person having ordinary skill in the art in this area, such as silicon-based oxide or nitride. It may also be made of the same material that has been used for any aforementioned dielectric layer.

The size of both the first assistant substrate 400 and the second assistant substrate 500 may be chosen based on the size of the device and the requirements of the fabrication process.

Referring to FIGS. 3N2 and 3N3, shapes of the top plan views of the first cavity 312 and the second cavity 315 area first polygon 3120 and a second polygon 3150, respectively. The first cavity 312 is facing the second cavity 315. Referring to FIG. 2B, the top plan views of the first and the second cavities have an overlapped region, which forms a third polygon 2070. The third polygon 2070 may be any polygon. For example it may be a quadrilateral a pentagon, a hexagon, a heptagon, or an octagon. The third polygon 2070 does not have any parallel sides.

The first polygon 3120 and the second polygon 3150 can be any polygon. For example, it can be a quadrilateral, a pentagon, or a hexagon. The third polygon 2070 does not have any parallel sides, this design can reduce, if not eliminate, the interfering horizontal acoustic resonance that may otherwise originate from, and be reinforced by, the parallel sides in the acoustic resonance film.

The FBAR includes the dielectric layers, the lower electrode layer 305, the piezoelectric film 3063, the adhesive layer 3062, the first cavity 312, and the second cavity 315.

As described above, the semiconductor apparatus in the inventive concept comprises a FBAR, which comprises a continuous acoustic resonance film, The acoustic resonance film completely separates the first cavity 312 and the second cavity 315. As there is no through-hole in the acoustic resonance film, the FBAR and the semiconductor apparatus comprising such a FBAR can offer better acoustic resonance performance.

Figure 4:
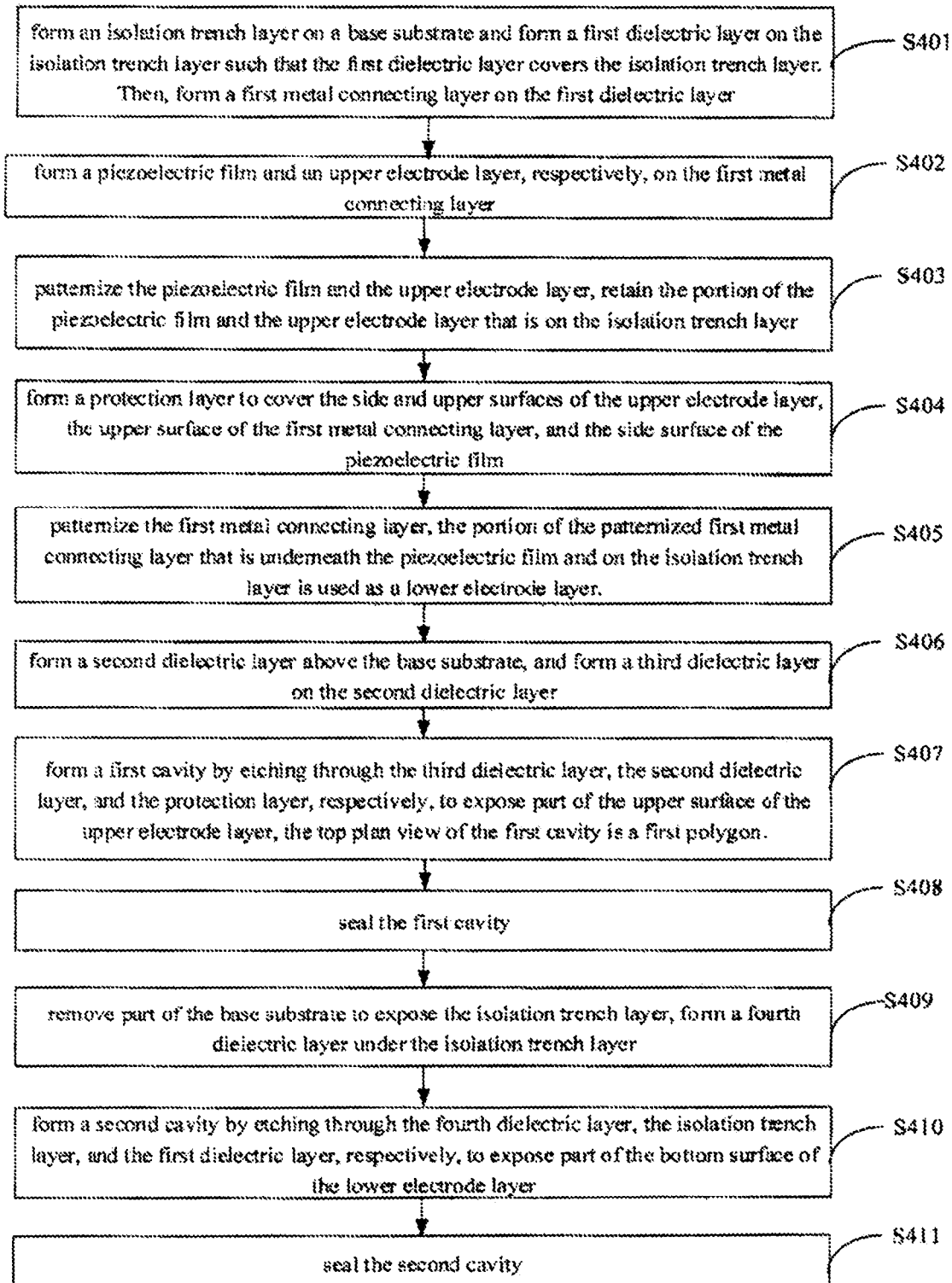
FIG. 4 shows a flow chart that illustrates a method for manufacturing a semiconductor apparatus in accordance with one or more embodiments of the inventive concept.

FIG. 4 presents a manufacturing method for this semiconductor apparatus. As depicted, the manufacturing method includes the following processes:

In S401, form an isolation trench layer on a base substrate and form a first dielectric layer on the isolation trench layer such that the first dielectric layer covers the isolation trench layer. Then, form a first metal connecting layer on the first dielectric layer.

In S402, form a piezoelectric film and an upper electrode layer, respectively, on the first metal connecting layer.

In S403, patternize the piezoelectric film and the upper electrode layer, retain the portion of the piezoelectric film and the upper electrode layer that is on the isolation trench layer.

In S404, form a protection layer to cover the side and upper surfaces of the upper electrode layer, the upper surface of the first metal connecting layer, and the side surface of the piezoelectric film.

In S405, patternize the first metal connecting layer, the portion of the patternized first metal connecting layer that is underneath the piezoelectric film and on the isolation trench layer is used as a lower electrode layer.

In S406, form a second dielectric layer above the base substrate, and form a third dielectric layer on the second dielectric layer.

In S407, form a first cavity by etching through the third dielectric layer, the second dielectric layer, and the protection layer, respectively, to expose part of the upper surface of the upper electrode layer, the top plan view of the first cavity is a first polygon.

In S408, seal the first cavity.

In S409, remove part of the base substrate to expose the isolation trench layer, form a fourth dielectric layer under the isolation trench layer.

In S410, form a second cavity by etching through the fourth dielectric layer, the isolation trench layer, and the first dielectric layer, respectively, to expose part of the bottom surface of the lower electrode layer.

In S411, seal the second cavity.

An acoustic resonance film of the inventive concept may comprise the lower electrode layer, the piezoelectric film, and the upper electrode layer. The top plan views of the first and the second cavities have an overlapped region having the shape of third polygon that does not have any parallel sides.

The FBAR of the present disclosure comprises a continuous acoustic resonance film that completely separates the first and the second cavities. There is no through-hole that extends through the acoustic resonance film, therefore such a FBAR offers better acoustic resonance performance, which in turn improves the performance of the semiconductor apparatus comprising of the FBAR. In addition, the manufacturing method of the FBAR can be integrated into existing CMOS fabrication processes.

A Third Embodiment

Referring to FIGS. 3A, 3B, 3C, 3D, 3E, 3F1, 3F2, 3G, 3H, 3I, 3J, 3K, 3L1, 3L2, 3M, 3N1, 3N2, 3N3, 3O, and 3P, one embodiment of a manufacturing method for a semiconductor apparatus of the inventive concept is described. FIGS. 3A, 3B, 3C, 3D, 3E, 3F1, 3G, 3H, 3I, 3J, 3K, 3L1, 3M, 3N1, 3O, and 3P show the cross-sectional views that illustrate the elements and/or structures formed in accordance with one or more embodiments of the manufacturing method. FIGS. 3F2, 3L2, 3N2, and 3N3 show the top plan view of the first or the second cavity.

Referring to FIG. 3A, a base substrate 300 is provided, and an isolation trench layer 302 is formed on the base substrate 300. A first dielectric layer 303 is formed above the substrate 300 such that it covers the isolation trench layer 302. A first metal connecting layer 3051 is formed on the first dielectric layer 303, The base substrate 300 may be a silicon-based substrate, it may be made of silicon (Si), germanium (Ge), silicon-germanium (SiGe), silicon carbide (SiC) silicon-germanium-carbon compound (e.g. SiGeC), indium arsenide (InAs), gallium arsenide (GaAs), indium phosphide (InP), other III-V group semiconductor materials, or a semiconductor multi-layer structure comprising of these semiconductor materials. The base substrate 300 may also be made of silicon-on-insulator (SOI), silicon-on-silicon-on-insulator (SSOI), silicon-on-silicon-germanium-on-insulator (S-SiGeOI), silicon-germanium-on-insulator (SiGeOI), or germanium-on-insulator (GeOI). It may also be made of other materials that can work as a supportive foundation, such as alumina ceramic, quartz, or glass.

The isolation trench layer 302 may be formed by any process that is well known to a person having ordinary skill in the art in the relevant field, such as photo-lithography, etching, or deposition. A filling material, such as silicon-based oxide or nitride, may be used to fill the isolation trench layer 302.

The first dielectric layer 303 may be made of materials such as silicon-based oxide or nitride. For example, it may be made of silicon dioxide ($SiO_2$), carbon-fluorine compound (CF), carbon-doped silicon oxide (SiOC), silicon nitride (SiN), or silicon carbonitride (SiCN). Alternatively, the first dielectric layer 303 may also be made of carbon-fluorine compounds comprising of carbonitride (SiCN) film. The major components of the carbon-fluorine compound are fluorine (F) and carbon (C). The carbon-fluorine compounds may also be made of non-crystalline materials.

The first dielectric layer 303 may be formed by any deposition process that is well known to a person having ordinary skill in the art in this area. For example, it may be formed by Chemical Vapor Deposition or Physical Vapor Deposition. The Chemical Vapor Deposition may be thermal Chemical Vapor Deposition (thermal CVD) process or High Density Plasma (HDP) process.

The thickness of the deposition may be determined by the size of the semiconductor apparatus and is not limited here.

Referring to FIG. 3A, in one embodiment, a transistor 301 may be formed outside the isolation trench layer 302, the transistor 301 is formed before the first dielectric layer 303 and is covered by the first dielectric layer 303. Additionally, several first contact holes 304 may be formed above the base substrate 300, the first contact holes 304 go through the first dielectric layer 303 to electrically connect to the transistor 301. Part of the first metal connecting layer 3051 is also electrically connected to the first contact holes 304.

The transistor 301 may be any front-end device or semiconductor device that is well known to a person having ordinary skill in the art in this area, and is not limited to a "transistor"0 in a narrow sense of the word. The transistor 301 may be a Metal-Oxide-Semiconductor (MOS) transistor. For a MOS transistor, the first contact holes 304 may be connected to the gate, source, or drain terminal of the MOS transistor, respectively.

The first metal connecting layer 3051 may be made of a conductive material. The conductive material may be one or more conductive metals such as aluminum (Al), copper (Cu), platinum (Pt), gold (Au), iridium (Ir), osmium (Os), rhenium (Re), palladium (Pd), rhodium (Rh), or ruthenium (Ru). The conductive metal may also be molybdenum (Mo) film or tungsten (W) film. The metal material may be deposited by Low Pressure Chemical Vapor Deposition (LPCVD) Plasma Enhanced Chemical Vapor Deposition (PECVD), Metal Organic Chemical Vapor Deposition (MOCVD), Atomic Layer Deposition (ALD), or other advanced deposition techniques.

The first metal connecting layer 3051 may also be made of any suitable semiconductor material such as silicon (Si), germanium (Ge), silicon-germanium (SiGe), silicon carbide (SiC), or silicon-germanium-carbon compound (e.g. SiGeC). The semiconductor material may be deposited by Low Pressure Chemical Vapor Deposition (LPCVD), Plasma Enhanced Chemical Vapor Deposition (PECVD), Ultra High Vacuum Chemical Vapor Deposition (UHVCVD), Rapid Thermal Chemical Vapor Deposition (RTCVD), or Molecular Beam Epitaxy (MBE).

Other than establishing an electrical connection to the transistor 301, part of the first metal connecting layer 3051 may also be used as a lower electrode layer. The thickness of the lower electrode layer may be chosen based on the target resonance frequency or wavelength. For example, it may be set at ¹/₁₀ of the target resonance wavelength. Therefore the thickness of the first metal connecting layer 3051 may also be chosen based on the target resonance frequency or wavelength. It may also be set, for example, at ¹/₁₀ of the target resonance wavelength.

Referring to FIG. 3B, a piezoelectric film 3063 and an upper electrode layer 3064 is formed, respectively, on the first metal connecting layer 3051.

In one embodiment, before the piezoelectric film 3063 is formed, a separation layer 3061 may be optionally formed on the first metal connecting layer 3051.

The separation layer 3061 may be made of silicon-based oxide or nitride, such as silicon oxide, silicon nitride, or inorganic material in silicon oxynitride. In this embodiment, the separation layer 3061 is made of silicon oxide. The separation layer 3061 may be formed by any deposition method that is well known to a person having ordinary skill in the art in this area, such as Chemical Vapor Deposition or Physical Vapor Deposition.

In one embodiment, after the separation layer 3061 has been formed but before the piezoelectric film 3063 is formed, an adhesive layer 3062 may be formed on the separation layer 3061.

The adhesive layer 3062 may be made of crystals with wurtzite crystal structure. In this embodiment, it is made of molybdenum (Mo). The adhesive layer 3062 may be formed by Low Pressure Chemical Vapor Deposition (LPCVD), Plasma Enhanced Chemical Vapor Deposition (PECVD), Metal Organic Chemical Vapor Deposition (MOCVD), Atomic Layer Deposition (ALD), or other advanced deposition techniques.

The piezoelectric film 3063 may be made of piezoelectric materials with wurtzite crystal structure, such as zinc oxide (ZnO), aluminum nitride (AlN), or gallium nitride (GaN). In this embodiment, it is made of aluminum nitride (AlN). The piezoelectric film 3063 may be deposited by methods such as vacuum evaporating, sputtering, Chemical Vapor Deposition (CVD), or molecular beam epitaxy (MBE).

In one embodiment, when aluminum nitride (AlN) is used for the piezoelectric film 3063, the piezoelectric film 3063 may be formed by Radio Frequency (RF) magnetron sputtering. Specifically, an AlN piezoelectric film 3063 may be formed by RF magnetron sputtering at a base temperature of 200° C. in Helium and Nitrogen gas with aluminum being used as the negative terminal.

The thicknesses of the piezoelectric film 3063 may be chosen based on the target resonance frequency or wavelength. Optimally, it may be set at half of the target resonance wavelength.

The upper electrode layer 3064 may be made of a conductive or semiconductor material. The conductive material may be a conductive metal such as aluminum (Al), copper (Cu), gold (Au), platinum (Pt), or copper alloys. The semiconductor material may be silicon (Si), germanium (Ge), silicon-germanium (SiGe), silicon carbide (SiC), or silicon-germanium-carbon compound (e.g. SiGeC).

The upper electrode layer 3064 may be formed by Low Pressure Chemical Vapor Deposition (LPCVD), Plasma Enhanced Chemical Vapor Deposition (PECVD), Metal Organic Chemical Vapor Deposition (MOCVD), Atomic Layer Deposition (ALD), or other advanced deposition techniques.

The thicknesses of the upper dielectric layer 3064 may be chosen based on the target resonance frequency or wavelength. Optimally, it may be set at ¹/₁₀ of the target resonance wavelength.

Additional separation layers (not shown) may be formed between the upper electrode layer 3064 and the piezoelectric film 3063. These separation layers may be made of silicon-based oxide or nitride, such as silicon oxide, silicon nitride, or the inorganic material in silicon oxynitride.

Referring to 3C, the piezoelectric film 3063 and the upper electrode layer 3064 is patternized, the portion of the piezoelectric film 3063 and the upper electrode layer 3064 that is on top of the isolation trench layer 302 will be retained.

The patternization process may be performed by first forming a photoresist layer on the tipper electrode layer 3064, the photoresist layer covers to-be-retained region of the piezoelectric film 3063 and the upper electrode layer 3064 and may be formed by spin coating exposure and development on the upper electrode layer 3064, then the patternization may be performed by etching through the portion of the upper electrode layer 3064 and the piezoelectric film 3063 that is not covered by the photoresist layer.

The etching process used in the patternization process may be a dry etching or a wet etching process. The dry etching process may be Reactive Ion Etching (RIE), ion etching, plasma etching, or laser cutting. The etchant may be chosen based on the material used in the layers. For example, for metal layer, the etchant may be chlorine ($Cl_2$), boron trichloride ($BCl_3$), argon (Ar), nitrogen ($N_2$), trifluoromethane ($CHF_3$), or ethylene ($C_2H_4$). Chlorine ($Cl_2$) may be used as the major etchant. In one embodiment, when there exists the separation layer 3061 and the adhesive layer 3062, the patternization process will also apply on the adhesive layer 3062 but not on the separation layer 3061.

Referring to FIG. 3C, a protection layer 307 may be formed to cover the side and upper surfaces of the tipper electrode layer 3064, the side surface of the piezoelectric 3063, and the upper surface of the first metal connecting layer 3051.

Additionally, when the separation layer 3061 is formed on the first metal connecting layer 3051, and the adhesive layer 3062 is formed between the piezoelectric film 3063 and the upper electrode layer 3064, the protection layer 307 covers the side and upper surfaces of the upper electrode layer 3064, the side surface of the piezoelectric film 3063 and the adhesive layer 3062, and the upper surface of the separation layer 3061.

The protection layer 307 protects the film and layers it covers, such as the upper electrode layer 3064 and the piezoelectric film 3063, so that those film and layers will not be accidentally damaged by the etching processes in succeeding stages.

The protection layer 307 may be made of silicon-based oxide, nitride, or oxynitride, it may also be made of the same material that has been used for the fast dielectric layer 303 or any other dielectric material that is well known to a person having ordinary skill in the art in this area.

The protection layer 307 may be formed by any deposition process that is well known to a person having ordinary skill in the art in this area. For example, it may be formed by Chemical Vapor Deposition or Physical Vapor Deposition.

Referring to FIG. 3D, a lower electrode layer 305 may be formed by patternizing the first metal connecting layer 3051. The lower electrode layer 305 comprises the portion of the patternized first metal connecting layer 3051 that is underneath the piezoelectric film 3063 and on the isolation trench layer 302.

The patternization process on the first metal connecting layer 3051 may be performed by first forming a photoresist layer on the protection layer 307, the photoresist layer covers to-be-retained region and may be formed by spin coating exposure and development on the protection layer 307, then the patternization may be performed by etching through the portion of protection layer 307, the separation layer 3061, and the first metal connecting layer 3051 that is not covered by the photoresist layer. The patternization process will not affect the upper electrode layer 3064 and the piezoelectric film 3063. The top plan view of the lower electrode layer 305 is larger than that of the upper electrode layer 3064 or the piezoelectric film 3063.

After the patternization process, other than the portion that has been used as the lower electrode layer 305, other portion of the first metal connecting layer 3051 that is on the transistor 301 may be electrically connected to different first contact hole 304.

The etching process used in the patternization process may be a dry etching or a wet etching process. The dry etching process may be Reactive Ion Etching (RIE), ion etching, plasma etching, or laser cutting. The etchant may be chosen based on the material used in the layers. For example, for metal layer, the etchant may be Chlorine ($Cl_2$), boron trichloride ($BCl_3$), argon (Ar), nitrogen ($N_2$), trifluoromethane ($CHF_3$), or ethylene ($C_2H_4$). Chlorine ($Cl_2$) may be used as the major etchant.

An acoustic resonance film in the present inventive concept comprises the lower electrode layer 305, the separation layer 3061, the adhesive layer 3062, the piezoelectric film 3063, and the upper electrode layer 3064. The acoustic resonance film may further comprise additional films or layers to facilitate the operations of actual devices, the detail composition of the acoustic resonance film is not limited by this embodiment.

Referring to FIG. 3D, a second dielectric layer 308 may be formed above the base substrate 300 to cover the first dielectric layer 303 and the protection layer 307. A planarization process may be applied on the second dielectric layer 308. The planarization process may be a Chemical Mechanical Polishing (CMP) process, the second dielectric layer 308 will completely cover the protection layer 307 after the planarization process.

The second dielectric layer 308 may be made of any dielectric material that is well known to a person having ordinary skill in the art in this area. It may be made of materials such as silicon-based oxide or nitride. For example, it may be made of silicon dioxide ($SiO_2$), carbon-fluorine compound (CF), carbon-doped silicon oxide (SiOC), silicon nitride (SiN), or silicon carbonitride (SiCN). Alternatively, the second dielectric, layer 308 may also be made of carbon-fluorine compounds comprising of carbonitride (SiCN) film. The major components of the carbon-fluorine compound are fluorine (F) and carbon (C). The carbon-fluorine compounds may also be made of non-crystalline materials. The second dielectric layer 308 may also be made of the same material that has been used for the first dielectric layer 303.

The second dielectric layer 308 may be formed by any deposition process that is well known to a person having ordinary skill in the art in this area. For example, it may be formed by Chemical Vapor Deposition or Physical Vapor Deposition. The Chemical Vapor Deposition may be thermal Chemical Vapor Deposition (thermal CVD) process or High Density Plasma (HDP) process.

The thickness of the deposition may be determined by the size of the semiconductor apparatus and is not limited here.

Referring to FIG. 3E, a third dielectric layer 311 may be form on the second dielectric layer 308.

In one embodiment, before the third dielectric layer 311 is formed, additional steps A1 to A3 may be performed:

Step A1: form a second contact bole 3091 that is electrically connected to the lower electrode layer 305; form a third contact hole 3092 that is electrically connected to the upper electrode layer 3064: form a fourth contact hole 3093 that is electrically connected to the transistor 301.

The second contact hole 3091 goes through the second dielectric layer 308, the protection layer 307, and the separation layer 3061, respectively, to electrically connect to the lower electrode layer 305, The third contact hole 3092 goes through the second dielectric, layer 308 and the protection layer 307, respectively, to electrically connect to the upper electrode layer 3064. The fourth contact hole 3093 goes through the second dielectric layer 308, the protection layer 307, and the separation layer 3061, respectively, to electrically connect to a portion of the first metal connecting layer 3051 that has not been used as the lower electrode layer 305 and is electrically connected to the transistor 301.

Step A2: form a patternized second metal connecting layer 310 on the second dielectric layer 308. Different portion of the patternized second metal connecting layer 310 is electrically connected to the second contact hole 3091, the third contact hole 3092, and the fourth contact hole 3093, respectively.

Step A3: a third dielectric layer 311 is formed to cover the second dielectric layer 308 and the patternized second metal connecting layer 310. A planarization process ma be applied on the third dielectric layer 311. The planarization process may be a Chemical Mechanical Polishing (CMP) process, the third dielectric layer 3111 will completely cover the second metal connecting layer 310 after the planarization process.

The third dielectric layer 311 may be made of any dielectric material that is well known to a person having ordinary skill in the art in this area. It may be made of materials such as silicon-based oxide or nitride. For example, it may be made of silicon dioxide ($SiO_2$), carbon-fluorine compound (CF), carbon-doped silicon oxide (SiOC), silicon nitride (SiN), or silicon carbonitride (SiCN). Alternatively, the third dielectric layer 311 may also be made of carbon-fluorine compounds comprising of carbonitride (SiCN) film. The major components of the carbon-fluorine compound are fluorine (F) and carbon (C). The carbon-fluorine compounds may also be made of non-crystalline materials. The third dielectric layer 311 may also be made of the same material that has been used for any aforementioned dielectric layer.

The third dielectric layer 311 may be formed by any deposition process that is well known to a person having ordinary skill in the art in this area. For example, it may be formed by Chemical Vapor Deposition or Physical Vapor Deposition. The Chemical Vapor Deposition may be thermal Chemical Vapor Deposition (thermal CVD) process or High Density Plasma (HDP) process.

The thickness of the deposition may be determined by the size of the semiconductor apparatus and is not limited here.

Referring to FIGS. 3F1 and 3F2, a first cavity 312 may be formed by etching through the third dielectric layer 311, the second dielectric layer 308, and the protection layer 307, respectively, until part of the upper surface of the upper electrode layer 3064 is exposed. The top plan view of the first cavity 312 is a first polygon 3120 (in FIG. 3F2). Optionally, the first polygon 3120 may have at least one pair of parallel sides as shown in FIG. 3F2.

The first cavity 312 may be formed by first forming a photoresist layer on the third dielectric layer 311 to define the position and shape of the first cavity 312. The photoresist layer covers to-be-retained region and may be formed by spin coating, exposure and development on the third dielectric layer 311. Then, the first cavity 312 may be formed by etching through the portion of the third dielectric layer 311, the second dielectric layer 308, and the protection layer 307 that is not covered by the photoresist layer until part of the upper surface of the upper electrode layer 3064 is exposed.

The etching process used to form the first cavity 312 may be a dry etching or a wet etching process. The dry etching process may be Reactive Ion Etching (RIE), ion etching, plasma etching, or laser cutting. The etchant can be, for example, oxygen-based gas if plasma etching is used.

Then the first cavity 312 may be sealed by any suitable method, two of the methods that may be used to seal the first cavity 312 are described below.

Referring to FIG. 3G, the first method to seal the first cavity 312 comprises the following steps.

First, a first bonding layer 401 may be formed on a first assistant substrate 400. Then the first bonding layer 4011 is bonded with the third dielectric layer 311 to seal the first cavity 312.

The first assistant substrate 400 works as a supportive foundation, it may be made of any semiconductor substrate material such as silicon, alumina ceramic, quartz, or glass.

Optionally, the first bonding layer 401 may be made of silicon-based oxide and may be deposited by thermal oxidation, Chemical Vapor Deposition, or Physical Vapor Deposition.

In one embodiment, the first bonding layer 401 may be bonded with the third dielectric layer 311 by melted bonding. A thickness reduction process may be optionally applied on the bottom side of the base substrate 300, and may include an etching process or a Chemical Mechanical Polishing process. FIG. 3G shows the base substrate 300 after the thickness reduction process.

This concludes the first method that may be used to seal the first cavity 312.

Referring to FIGS. 3H to 3J, a second method to seal the first cavity 312 comprises the following steps.

First, referring to FIG. 3H, a first sacrificial material layer 3121 may be deposited to completely fill the first cavity 312. A planarization process may be applied to the first sacrificial material layer 3121 to remove excess first sacrificial material layer 3121 that is outside the first cavity 312, the planarization process may be a Chemical Mechanical Polishing process and will stop upon reaching the surface of the third dielectric layer 311. Then a first cover layer 312a may be formed to cover the third dielectric layer 311 and the remaining first sacrificial material layer 3121.

The material used for the first sacrificial material layer 3121 will have a higher etching selectivity rate than the materials used for the second dielectric layer 308, the third dielectric layer 311, the protection layer 307, the upper electrode layer 3064, and the first cover layer 312a. For example, when silicon oxide is used for the second dielectric layer 308, the third dielectric layer 311, the protection layer 307, and the first cover layer 312a, the material used for the first sacrificial material layer 3121 may be silicon nitride (SiN) or silicon carbonitride (SiCN). The first sacrificial material layer 3121 may be formed by Chemical Vapor Deposition or Physical Vapor Deposition.

The first cover material layer 312a may be made of one of many dielectric materials including, but not limited to, oxide, nitride, or oxynitride. For example, it may be made of silicon-based oxide, nitride, carbide, or oxynitride. The first cover layer 312a may be formed by Chemical Vapor Deposition.

Second, referring to FIG. 3I, at least one first release hole may be formed to expose the first sacrificial material layer 3121 that is inside the first cavity 312. The first release hole goes through the first cover layer 312a to reach the first sacrificial material layer 3121. The first sacrificial material layer 3121 may be removed through the first release hole, then the first cavity 312 may be sealed by filling the first release hole with a first sealing material 313. The first sealing material layer 313 also covers the top of the first cover layer 312a.

Specifically, to carry out this process, a photoresist layer that defines the position and shape of the first release hole may first be formed on the first cover layer 312a by spin coating, exposure and development. Then the first release hole may be formed by etching through the portion of the first cover layer 312a that is not covered by the photoresist layer until the first sacrificial material layer 3121 is exposed.

The etching process used to form the first release hole may be a dry etching or a wet etching process. The dry etching process may be Reactive Ion Etching (RIE), ion etching, plasma etching, or laser cutting. The etchant can be, for example, oxygen-based gas if plasma etching is used.

In one embodiment, a wet etching process using an etchant that has a higher etching selectivity rate than the material used in the first sacrificial material layer 3121 may be used to remove the first sacrificial material layer 3121. For example, when the first sacrificial material layer 3121 made of silicon nitride, an etchant comprising of hot phosphoric acid may be used to remove the first sacrificial material layer 3121.

The first sealing material layer 313 may be made of any sealing material that is well known, such as silicon dioxide. The material may also be the same material that has been used for any aforementioned dielectric layer. The first sealing material layer 313 may be formed by Chemical Vapor Deposition or Physical Vapor Deposition.

Referring to FIG. 3J, a first bonding layer 401 may be formed on a first assistant substrate 400. Then the first bonding layer 401 is bonded with the first sealing material layer 313 to seal the first cavity 312. Specifically, the first bonding layer 401 may be bonded with the first sealing material layer 313 by melted bonding.

A thickness reduction process may be optionally applied on the bottom side of the base substrate 300. The thickness reduction process may be an etching process or a Chemical Mechanical Polishing process. FIG. 3J shows the base substrate 300 after the thickness reduction process.

This concludes the second method that may be used to seal the first cavity 312.

After the first cavity 3112 is formed, further processes will be applied on the bottom side of the base substrate 300.

FIG. 3K shows the structure turned upside down relative to the orientation of FIG. 3J. The base substrate 300 is removed to expose the isolation trench layer 302. A fourth dielectric layer 314 is formed on the exposed surface of the isolation trench layer 302.

Depending on the material used for the base substrate 300, different methods may be used to remove the base substrate 300. For example, when the base substrate 300 is made of silicon, it may be removed by etching or Chemical Mechanical Polishing.

Referring to FIG. 3K, the fourth dielectric layer 314 covers a side of the base substrate 300 that is opposing to that covered by the first dielectric layer 303. The fourth dielectric layer 314 may be made of materials such as silicon-based oxide or nitride. For example, it may be made of silicon dioxide ($SiO_2$), carbon-fluorine compound (CF), carbon-doped silicon oxide (SiOC), silicon nitride (SiN), or silicon carbonitride (SiCN). Alternatively, the fourth dielectric layer 314 may also be made of carbon-fluorine compounds comprising of carbonitride (SiCN) film. The major components of the carbon-fluorine compound are fluorine (F) and carbon (C). The carbon-fluorine compounds may also be made of non-crystalline materials. The fourth dielectric layer 314 may also be made of the same material that has been used for any aforementioned dielectric layer.

The method to form the fourth dielectric layer 314 may be any deposition process that is well known to a person having ordinary skill in the art in this area. For example, it may be Chemical Vapor Deposition or Physical Vapor Deposition. The Chemical Vapor Deposition may be thermal Chemical Vapor Deposition (thermal CVD) process or High Density Plasma (HDP) process.

The thickness of the deposition may be determined by the size of the semiconductor apparatus and is not limited here.

Referring to FIGS. 3L1 and 3L2, a second cavity 315 may be formed by etching the fourth dielectric layer 314, the isolation trench layer 302, and the first dielectric layer 303, in that order, until the lower electrode layer 305 is exposed. The second cavity 315 is facing the first cavity 312 and has a top plan view of a second polygon 3150 (in FIG. 3L2). Optionally, the second polygon 3150 may have at least one pair of parallel sides, as shown FIG. 3L2.

The second cavity 315 may be formed by first forming a photoresist layer on the .fourth dielectric layer 314 to define the position and shape of the second cavity 315. The photoresist layer covers to-be-retained region and may be formed by spin coating, exposure and development on the surface of the fourth dielectric layer 314. Then the second cavity 315 may be formed by etching through the portion of the fourth dielectric layer 314, the isolation trench layer 302, and the first dielectric layer 303 that is not covered by the photoresist layer until the lower electrode layer 305 is exposed.

The etching process used to form the second cavity 315 in be a dry etching or a wet etching process. The dry etching process may be Reactive Ion Etching (RIE), ion etching, plasma etching, or laser cutting. The etchant can be, for example, oxygen-based gas if plasma etching is used.

The second cavity 315 is facing the first cavity 312, and the top plan view of each of these two cavities may be in the shape of any polygon. For example, each a the top plan views may be a quadrilateral, a pentagon, or a hexagon. The top plan views of these two cavities have an overlapped region, which has the shape of a third polygon.

Then, the second cavity 315 will be sealed. Two of the methods that may be used to seal the second cavity 315 are described below.

Referring to FIGS. 3M and 3N1, the first method to seal the second cavity 315 comprises the following steps.

As shown in FIG. 3M a second bonding layer 501 may be formed on a second assistant substrate 500. Then the second bonding layer 501 is bonded with the fourth dielectric layer 314 to seal the second cavity 315.

The second assistant substrate 500 works as a supportive foundation and may be made of any semiconductor substrate materials such as silicon, alumina ceramic, quartz, or glass.

Optionally, the second bonding layer 501 may be made of silicon-based oxide and may be deposited by thermal oxidation, Chemical Vapor Deposition, or Physical Vapor Deposition.

In one embodiment, the second bonding layer 501 may be bonded with the fourth dielectric layer 314 by melted bonding. A thickness reduction process may be optionally applied on the bottom side of the first assistant substrate 400, the thickness reduction process may be an etching process or a Chemical Mechanical Polishing process. FIG. 3M shows the first assistant substrate 400 after the thickness reduction process.

Referring to FIG. 3N1, the first assistant substrate 400 may also be completely removed after the thickness reduction process. The method to remove the first assistant substrate 400 may be any method that is well known to a person having ordinary skill in the art in this area, such as etching or a Chemical Mechanical Polishing process.

This concludes the first method that may be used to seal the second cavity 315.

Referring to FIGS. 3O and 3P, a second method to seal the second cavity 315 comprises the following steps.

First, referring to FIG. 3O, a second sacrificial material layer 3151 may be deposited to completely fill the second cavity 315. A planarization process is applied to the second sacrificial layer 3151 to remove the excess second sacrificial material layer 3151 that is outside the second cavity 315 by using, for example, a Chemical Mechanical Polishing process, and will stop upon reaching the surface of the fourth dielectric layer 314. Then, a second cover layer 315a may be formed to cover the fourth dielectric layer 314 and the remaining second sacrificial material layer 3151.

The material used for the second sacrificial material layer 3151 will have a higher etching selectivity rate than the materials used in the fourth dielectric layer 314, the lower electrode layer 305, and the second cover layer 315a. For example, when silicon oxide is used for the fourth dielectric layer 314 and the second cover layer 315a, the material used for the second sacrificial material layer 3151 may be silicon nitride (Si) or silicon carbonitride (SiCN). The second sacrificial material layer 3151 may be formed by Chemical Vapor Deposition or Physical Vapor Deposition.

The second cover layer 315a may be made of one of many dielectric materials including, but not limited to oxide, nitride, or oxynitride. For example, it may be made of silicon-based oxide, nitride, carbide, or oxynitride. The second cover layer 315a may be formed by Chemical Vapor Deposition.

Optionally, referring to FIG. 3O, a fifth contact hole 3161 may be formed to establish electrical connection to the lower electrode layer 305. The fifth contact hole 3161 goes through the second cover layer 315a, the fourth dielectric layer 314, the isolation trench layer 302, and the first dielectric layer 303, respectively, to electrically connect to the lower electrode layer 305. A third metal connecting layer 3162 may be formed on top of the second cover layer 315a.

Referring to FIG. 3O, a fifth dielectric layer 317 may be formed to cover the second cover layer 315a and the patternized third metal connecting layer 3162. The fifth dielectric layer 317 may be made of any suitable dielectric material that is well known, such as silicon-based oxide or nitride. It may also be made of the same material that has been used for any aforementioned dielectric layer.

The fifth dielectric layer 317 may be formed by any deposition process that is well known to a person having ordinary skill in the art in this area. For example, it may be formed by Chemical Vapor Deposition or Physical Vapor Deposition.

Second, referring to FIG. 3P, at least one second release hole may be formed. The second release hole goes through the fifth dielectric layer 317 and the second cover layer 315a, respectively, to expose the second sacrificial material layer 3151. The second sacrificial material layer 3151 may be completely removed through the second release hole. After that, the second cavity 315 may be sealed by filling the second release hole with a second sealing material 318.

Specifically, to carry out this process, a photoresist layer that defines the position and shape of the second release hole may be formed on the fifth dielectric layer 317 by spin coating, exposure and development. Then the second release hole may be formed by etching through the portion of the fifth dielectric layer 317 and the second cover layer 315a that is not covered by the photoresist layer until the second sacrificial material layer 3151 is exposed.

The etching process used to form the second release hole may be a dry etching or a wet etching process. The dry etching process may be Reactive Ion Etching (RIE), ion etching, plasma etching, or laser cutting. The etchant can be, for example, oxygen-based gas if plasma etching is used.

In one embodiment, a wet etching process using an etchant that has a higher etching selectivity rate than the material used in the second sacrificial material layer 3151 may be used to remove the second sacrificial material layer 3151. For example, when the second sacrificial material layer 3151 is made of silicon nitride, an etchant comprising of hot phosphoric acid may be used to remove the second sacrificial material layer 3151.

The second sealing material 318 may be any sealing material that is well known to a person having ordinary skill in the art in this area, such as silicon dioxide. It may also be the same material that has been used for any aforementioned dielectric layer. The second sealing material layer 318 may be formed by Chemical Vapor Deposition or Physical Vapor Deposition.

This concludes the second method that may be used to seal the second cavity 315.

Referring to FIGS. 3F2, 3L2, 3N2, and 3N3, the top plan views of first cavity 312 and the second cavity 315 are the first polygon 3120 and the second polygon 3150, respectively. The first polygon 3120 and the second polygon 3150 can be any polygon. For example, it can be a quadrilateral, a pentagon, or a hexagon.

Referring to FIG. 2B, the top plan views of the first and the second cavities have an overlap region having the shape of a third polygon 2070. The third polygon 2070 may be any polygon. For example, it may be a quadrilateral, a pentagon, a hexagon, a heptagon, or an octagon. The third polygon 2070 does not have any parallel sides. This design can reduce, if not eliminate, the interfering horizontal acoustic resonance that may otherwise originate from, and be reinforced by, the parallel sides in the acoustic resonance film.

The FBAR of the inventive concept comprises the dielectric layers, the lower electrode layer 305, the piezoelectric film 3063, the adhesive layer 3062, the first cavity 312, and the second cavity 315.

As described above, the semiconductor apparatus includes a FBAR that includes a continuous acoustic resonance film that completely separates the first cavity 312 from the second cavity 315. As there is no through-hole in the acoustic resonance film, the FBAR and the semiconductor apparatus comprising the FBAR can offer better acoustic resonance performance than a structure where the two cavities are connected.

This concludes the description of the FBAR, the semiconductor apparatus comprising of such a FBAR, and the manufacturing method for the semiconductor apparatus in the present inventive concept. Some prerequisite, intermediate, or follow up procedures that may be needed for a complete manufacturing procedure are omitted in this description in the interest of brevity.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. The abstract section is provided herein for convenience and due to word count limitation, is accordingly written for reading convenience and shall not be employed to limit the scope of the claims. It is therefore intended that the claims be interpreted as including all such alterations, permutations, and equivalents.

What is claimed is:

1. A thin-film bulk acoustic resonator (FBAR) apparatus, comprising:
   a lower dielectric layer including a first cavity;
   an upper dielectric layer including a second cavity, wherein the upper dielectric layer is on the lower dielectric layer; and
   an acoustic resonance film that is positioned between and separating the first and the second cavities, wherein the acoustic resonance film includes a lower electrode layer, an upper electrode layer, and a piezoelectric film that is sandwiched between the lower and upper electrode layers, and wherein a plan view of the first and the second cavities overlap to form an overlapped region having a polygonal shape without parallel sides.

2. The apparatus of claim 1, wherein the first cavity has a shape of a first polygon having at least one pair of parallel sides in plan view.

3. The apparatus of claim 1, wherein the second cavity has a shape of a second polygon having at least one pair of parallel sides in plan view.

4. The apparatus of claim 1, wherein the acoustic resonance film further comprises:
   an adhesive layer that is positioned between the piezoelectric film and the lower electrode layer; and
   one or more insulation layers positioned in one or both of: between the adhesive layer and the lower electrode layer, and between the piezoelectric film and the upper electrode layer.

5. A semiconductor apparatus, comprising:
   an isolation trench layer;
   a first dielectric layer formed on the isolation trench layer;
   a lower electrode layer formed on the first dielectric layer, wherein the lower electrode layer is above the isolation trench layer;
   a piezoelectric film formed on the lower electrode layer;
   an upper electrode layer formed on the piezoelectric film;
   a protection layer formed to cover the side and upper surfaces of the upper electrode layer, the side surface of the piezoelectric film, and part of the upper surface of the lower electrode layer;
   a second dielectric layer formed on the first dielectric layer and the protection layer;
   a third dielectric layer formed on the second dielectric layer;
   a first cavity formed above the isolation trench layer, the first cavity being an enclosed structure extending through the third dielectric layer, the second dielectric layer, and the protection layer, to the upper electrode layer and having a first polygonal shape in plan view;
   a fourth dielectric layer formed under the isolation trench layer;
   a second cavity formed under the piezoelectric film, the second cavity being an enclosed structure extending through the fourth dielectric layer, the isolation trench layer, and the first dielectric layer to part of the lower electrode layer and having a second polygonal shape in plan view, wherein the first and second cavities are facing each other, their plan views overlap to form an overlapped region having a shape of a third polygon without parallel sides; and
   an acoustic resonance film comprising of the lower electrode layer, the piezoelectric film, and the upper electrode layer.

6. The semiconductor apparatus of claim 5, wherein a first bonding layer bonds with the third dielectric layer to seal the first cavity.

7. The semiconductor apparatus of claim 6, further comprising:
   a first cover layer positioned between the first bonding layer and the third dielectric layer and sealing the first cavity;
   at least one first release hole formed in the portion of the first cover layer that is facing the first cavity, the first release hole extending through the first cover layer to the first cavity; and
   a first sealing material in the first release hole.

8. The semiconductor apparatus of claim 6, wherein the first bonding layer is formed on a first assistant substrate.

9. The semiconductor apparatus of claim 6, wherein a second bonding layer is formed on a second assistant substrate and bonded with the fourth dielectric layer to seal the second cavity.

10. The semiconductor apparatus of claim 7, further comprising:
    a second cover layer formed on the fourth dielectric layer, the second cover layer sealing the second cavity;
    a fifth dielectric layer formed on the second cover layer;
    at least one second release hole formed in the portion of the second cover layer and the fifth dielectric layer that is facing the second cavity; and
    a second sealing material in the second release hole.

11. The semiconductor apparatus of claim 5, further comprising:
    a transistor positioned outside the isolation trench layer and covered by the first dielectric layer; and
    a patternized first metal connecting layer formed on the first dielectric layer and having a first portion and a second portion, wherein the first portion is electrically connected to the transistor, and the second portion that is on the isolation trench layer is the lower electrode layer and is not electrically connected to the transistor.

12. The semiconductor apparatus of claim 5, wherein the acoustic resonance film further comprises:
    an adhesive layer positioned between the piezoelectric film and the lower electrode layer; and
    one or more insulation layer positioned in at least one of: between the lower electrode layer and the adhesive layer, and between the upper electrode layer and the piezoelectric film.

* * * * *